US012213298B2

(12) United States Patent
Hirose

(10) Patent No.: US 12,213,298 B2
(45) Date of Patent: Jan. 28, 2025

(54) SEMICONDUCTOR STORAGE DEVICE COMPRISING A ONE-PORT SRAM CELL FORMED WITH THREE DIMENSIONAL TRANSISTORS

(71) Applicant: SOCIONEXT INC., Kanagawa (JP)

(72) Inventor: Masanobu Hirose, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 495 days.

(21) Appl. No.: 17/556,910

(22) Filed: Dec. 20, 2021

(65) Prior Publication Data

US 2022/0115389 A1 Apr. 14, 2022

Related U.S. Application Data

(63) Continuation of application No. PCT/JP2020/020978, filed on May 27, 2020.

(30) Foreign Application Priority Data

Jun. 21, 2019 (JP) .................................. 2019-115211

(51) Int. Cl.
*H10B 10/00* (2023.01)
*G11C 5/02* (2006.01)
(Continued)

(52) U.S. Cl.
CPC .......... *H10B 10/125* (2023.02); *G11C 5/025* (2013.01); *G11C 5/063* (2013.01); *G11C 11/412* (2013.01);
(Continued)

(58) Field of Classification Search
None
See application file for complete search history.

(56) References Cited

U.S. PATENT DOCUMENTS 5,517,038 A * 5/1996 Maeda ................. H10B 10/125
257/225
2013/0181274 A1 7/2013 Saitoh et al.
(Continued)

FOREIGN PATENT DOCUMENTS

JP H06-061452 A 3/1994
JP 2013-143536 A 7/2013
(Continued)

OTHER PUBLICATIONS

International Search Report issued in corresponding International Patent Application No. PCT/JP2020/020978), dated Aug. 4, 2020, with English translaiton.
(Continued)

*Primary Examiner* — Daniel Whalen
*Assistant Examiner* — Seyon Ali-Simah Punchbeddell
(74) *Attorney, Agent, or Firm* — Rimon P.C.

(57) ABSTRACT

Transistors (N3, N4) corresponding to a drive transistor (PD1), transistors (N5, N6) corresponding to a drive transistor (PD2), transistors (N7, N8) corresponding to an access transistor (PG1), and transistors (N1, N2) corresponding to an access transistor (PG2) are formed in a lower portion of a cell. Transistors (P1, P2) corresponding to load transistors (PU1, PU2), respectively, are formed in an upper portion of the cell. Further, the transistors (P1, P2) overlap the transistors (N3, N6) in plan view.

20 Claims, 13 Drawing Sheets

(51) Int. Cl.
  *G11C 5/06* (2006.01)
  *G11C 11/412* (2006.01)
  *H01L 29/06* (2006.01)
  *H01L 29/423* (2006.01)

(52) U.S. Cl.
  CPC ......... *H01L 29/0673* (2013.01); *H10B 10/18* (2023.02); *H01L 29/42392* (2013.01)

(56) References Cited

U.S. PATENT DOCUMENTS

2014/0133218 A1* 5/2014 Liaw .................. G11C 11/412
   438/283
2015/0325444 A1* 11/2015 Masuoka ............. H10B 10/125
   438/268
2020/0075592 A1* 3/2020 Liebmann ........... H01L 27/0688

FOREIGN PATENT DOCUMENTS

WO   2014/184933 A1   11/2014
WO   WO-2014185085 A1 * 11/2014 ......... H01L 27/0688

OTHER PUBLICATIONS

Written Opinion issued in corresponding International Patent Application No. PCT/JP2020/020978), dated Aug. 4, 2020, with partial English translaiton.
Ryckaert J. et al., "The Complementary FET (CFET) for CMOS scaling beyond N3," 2018 Symposium on VLSI Technology Digest of Technical Papers; 2018 IEEE pp. 141-142.
A. Mocuta et al., "Enabling CMOS Scaling Towards 3nm and Beyond," 2018 Symposium on VLSI Technology Digest of Technical Papers, 2018 IEEE, pp. 147-148.

* cited by examiner

SEMICONDUCTOR STORAGE DEVICE COMPRISING A ONE-PORT SRAM CELL FORMED WITH THREE DIMENSIONAL TRANSISTORS

CROSS-REFERENCE TO RELATED APPLICATIONS

This is a continuation of International Application No. PCT/JP2020/020978 filed on May 27, 2020, which claims priority to Japanese Patent Application No. 2019-115211 filed on Jun. 21, 2019. The entire disclosures of these applications are incorporated by reference herein.

BACKGROUND

The present disclosure relates to a semiconductor memory device having a three-dimensional transistor, and in particular, relates to a layout configuration of a 1-port static random access memory (SRAM) cell using a three-dimensional transistor.

BACKGROUND ART

An SRAM is a widely used semiconductor integrated circuit.

Further, the gate length of a transistor which is a basic component of an LSI has been reduced (scaling) to improve integration degree, reduce the operating voltage, and improve the operating speed. However, an off-current due to excessive scaling and a significant increase in power consumption due to the off-current have been concerned in recent years. To address these concerns, studies have been actively conducted for a transistor having a three-dimensional configuration (hereinafter, three-dimensional transistor) in which a configuration of a transistor is changed from a traditional planar type to a three-dimensional type.

Non-Patent Documents 1 and 2 disclose, as a novel device, a three dimensional device in which a P-type FET and an N-type FET each having a three-dimensional configuration are stacked in a direction perpendicular to a substrate, and an SRAM cell (hereinafter, also simply referred to as cell) using such a three-dimensional device.

CITATION LIST

Non-Patent Documents

Non-Patent Documents 1: Ryckaert J. et al., "The Complementary FET (CFET) for CMOS scaling beyond N3", 2018 Symposium on VLSI Technology Digest of Technical Papers Non-Patent Documents 2: A. Mocuta et al., "Enabling CMOS Scaling Towards 3 nm and Beyond", 2018 Symposium on VLSI Technology Digest of Technical Papers

SUMMARY OF THE INVENTION

Technical Problem

A three dimensional device having a three-dimensional P-type FET and a three-dimensional N-type FET stacked perpendicularly to a substrate is referred to as a CFET (Complementary FET) in this specification, as in the description of Non-Patent Document 1. Further, a direction perpendicular to the substrate is referred to as a depth direction.

FIG. 4 of Non-Patent Document 1 discloses a layout configuration of a 1-port SRAM cell using the CFET. In FIG. 4 of Non-Patent Document 1, each of six transistors constituting a 1-port SRAM circuit in the 1-port SRAM cell is configured by a single nanowire transistor.

However, in a 1-port SRAM cell, the performance ratio of the six transistors constituting the 1-port SRAM circuit is determined in consideration of the operation speed, operation stability, and the like of the circuit. To date, however, no specific consideration has been given as to the layout of a 1-port SRAM cell in which the six transistors are configured by different numbers of nanowire transistors.

An object of the present disclosure is to provide a layout configuration of a 1-port SRAM cell using a CI-ET, in which six transistors constituting a 1-port SRAM circuit of the 1-port SRAM cell are configured by different numbers of nanowire transistors.

Solution to the Problem

A first aspect of the present disclosure is a semiconductor memory device including a 1-port SRAM cell, in which the 1-port SRAM cell includes: a first transistor having one node connected to a first power source that supplies a first voltage, another node connected to a first node, and a gate connected to a second node; a second transistor having one node connected to the first power source, another node connected to the second node, and a gate connected to the first node; a third transistor having one node connected to the first node, another node connected to a second power source that supplies a second voltage different from the first voltage, and a gate connected to the second node; a fourth transistor having one node connected to the second node, another node connected to the second power source, and a gate connected to the first node; a fifth transistor having one node connected to a first bit line, another node connected to the first node, and a gate connected to a word line; and a sixth transistor having one node connected to the first bit line and a second bit line constituting a complementary bit line pair, another node connected to the second node, and a gate connected to the word line. Each of the third to sixth transistors is a three-dimensional transistor of a first conductive type formed in a first layer. Each of the first and second transistors is a three-dimensional transistor of a second conductive type different from the first conductive type, the three-dimensional transistor being formed in a second layer different from the first layer. The number of three-dimensional transistors constituting the first transistor and the number of three-dimensional transistors constituting the second transistors are smaller than the number of three-dimensional transistors constituting the third transistor and smaller than the number of three-dimensional transistors constituting the fourth transistor, respectively. The first and second transistors at least partially overlap the third and fourth transistors in plan view, respectively.

According to the present disclosure, the first to sixth transistors constitute the 1-port SRAM circuit, and the first to sixth transistors are each configured by three-dimensional transistors. Further, the number of three-dimensional transistors constituting the first transistor and the number of three-dimensional transistors constituting the second transistor are smaller than the number of three-dimensional transistors constituting the third transistor and smaller than the number of three-dimensional transistors constituting the fourth transistor, respectively. This way, it is possible to achieve a layout configuration of a 1-port SRAM cell using a CFET, in which six transistors constituting a 1-port SRAM circuit of the 1-port SRAM cell are configured by different numbers of nanowire transistors.

Further, the first and second transistors at least partially overlap the third and fourth transistors in plan view, respectively. That is, the first and second transistors are stacked on the third and the fourth transistors, respectively. This way, the area of the 1-port SRAM cell can be reduced.

A second aspect of the present disclosure is a semiconductor memory device including a 1-port SRAM cell, in which the 1-port SRAM cell includes: a first transistor having one node connected to a first power source that supplies a first voltage, another node connected to a first node, and a gate connected to a second node; a second transistor having one node connected to the first power source, another node connected to the second node, and a gate connected to the first node; a third transistor having one node connected to the first node, another node connected to a second power source that supplies a second voltage different from the first voltage, and a gate connected to the second node; a fourth transistor having one node connected to the second node, another node connected to the second power source, and a gate connected to the first node; a fifth transistor having one node connected to a first bit line, another node connected to the first node, and a gate connected to a word line; and a sixth transistor having one node connected to the first bit line and a second bit line constituting a complementary bit line pair, another node connected to the second node, and a gate connected to the word line. The third and fourth transistors each include: a first three-dimensional transistor that is a three-dimensional transistor of a first conductive type formed in a first layer; and a second three-dimensional transistor that is a three-dimensional transistor of the first conductive type formed in a second layer that is a layer above the first layer so that the second three-dimensional transistor at least partially overlaps the first three-dimensional transistor in plan view. Each of the fifth and sixth transistors includes a three-dimensional transistor of the first conductive type formed in at least one of the first or second layer. Each of the first and second transistors includes a three-dimensional transistor of a second conductive type different from the first conductive type formed in the second layer. The number of three-dimensional transistors constituting the first transistor and the number of three-dimensional transistors constituting the second transistors are smaller than the number of three-dimensional transistors constituting the third transistor and smaller than the number of three-dimensional transistors constituting the fourth transistor, respectively.

According to the present disclosure, the first to sixth transistors constitute the 1-port SRAM circuit, and the first to sixth transistors are each configured by three-dimensional transistors. Further, the number of three-dimensional transistors constituting the first transistor and the number of three-dimensional transistors constituting the second transistor are smaller than the number of three-dimensional transistors constituting the third transistor and smaller than the number of three-dimensional transistors constituting the fourth transistor, respectively. This way, it is possible to achieve a layout configuration of a 1-port SRAM cell using a CFET, in which six transistors constituting a 1-port SRAM circuit of the 1-port SRAM cell are configured by different numbers of nanowire transistors.

Further, in the third and fourth transistors, the first three-dimensional transistor at least partially overlaps the second three-dimensional transistor in plan view. That is, in each of the third and fourth transistors, the first three-dimensional transistor is stacked on the second three-dimensional transistor. This way, the area of the 1-port SRAM cell can be reduced.

Advantages of the Invention

According to the present disclosure, it is possible to achieve a layout configuration of a 1-port SRAM cell using a CFET, in which six transistors constituting a 1-port SRAM circuit of the 1-port SRAM cell are configured by different numbers of nanowire transistors.

DESCRIPTION OF EMBODIMENTS

Embodiments will be described in detail with reference to the drawings. The following embodiments assume that a semiconductor memory device includes a plurality of SRAM cells (simply referred to as cells as appropriate, in this specification), and that at least a part of the plurality of SRAM cells includes a CFET, that is, a three dimensional device in which a P-type FET and an N-type FET each having a three-dimensional configuration are perpendicularly stacked on a substrate.

Figure 10:
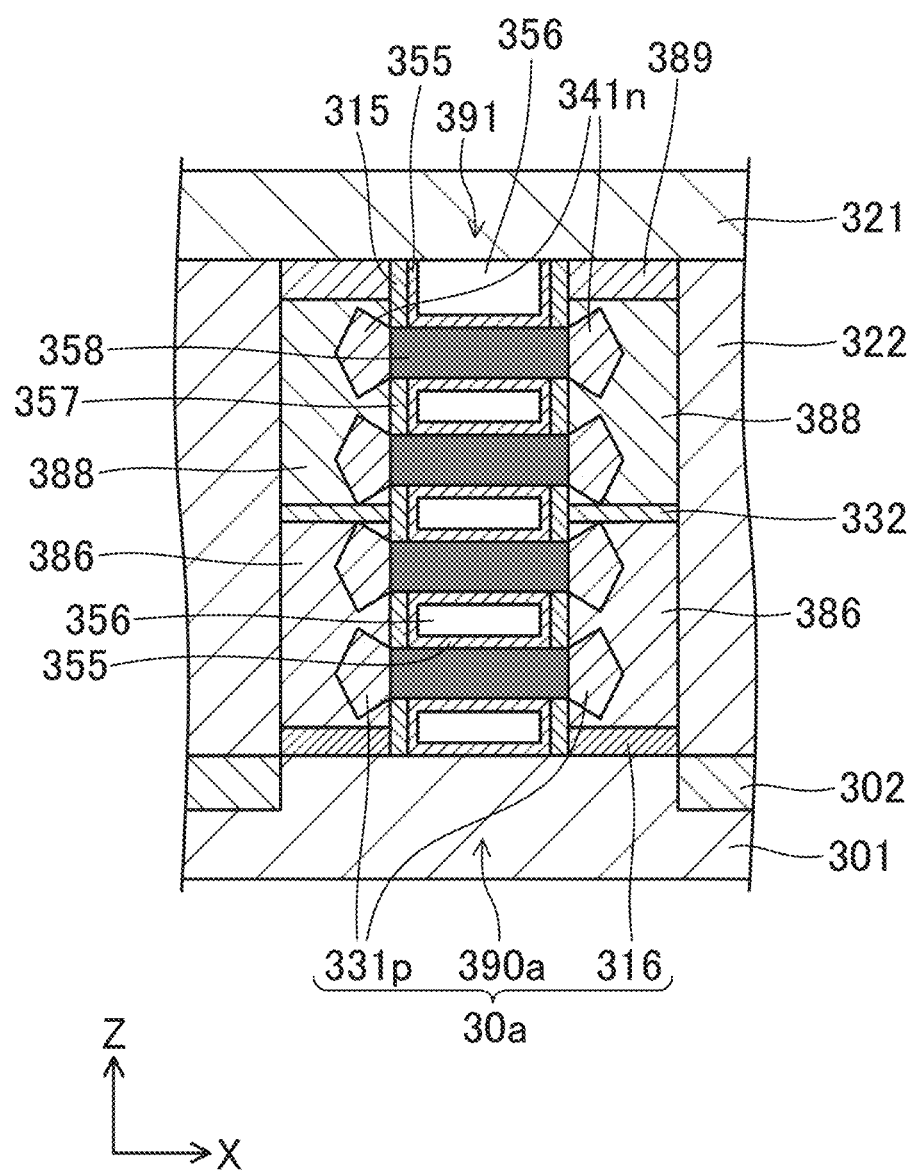
FIG. 10 is a cross-sectional view showing a configuration of a semiconductor device including a CFET.
Figure 11:
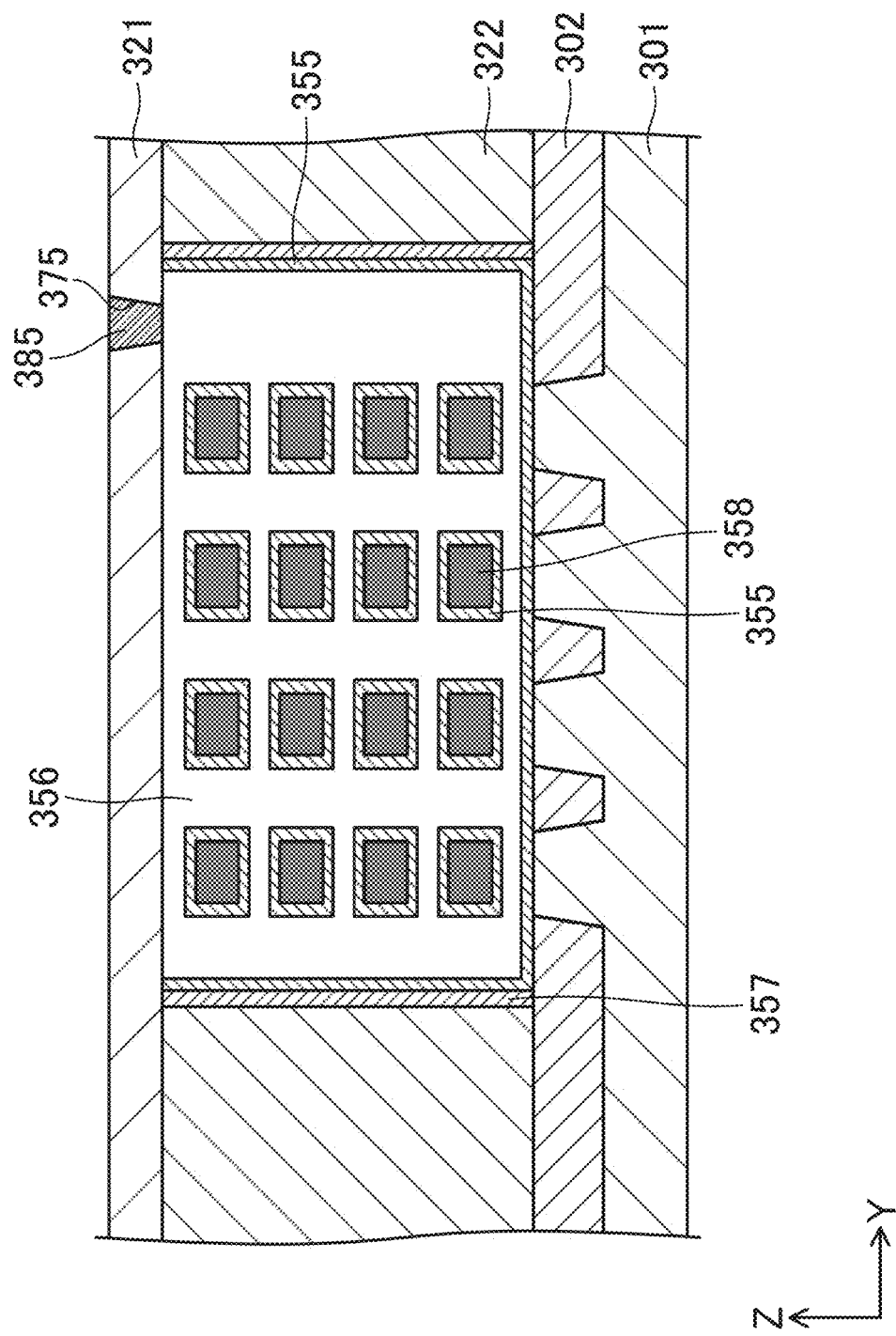
FIG. 11 is a cross-sectional view showing a configuration of a semiconductor device including a CFET.
Figure 12:
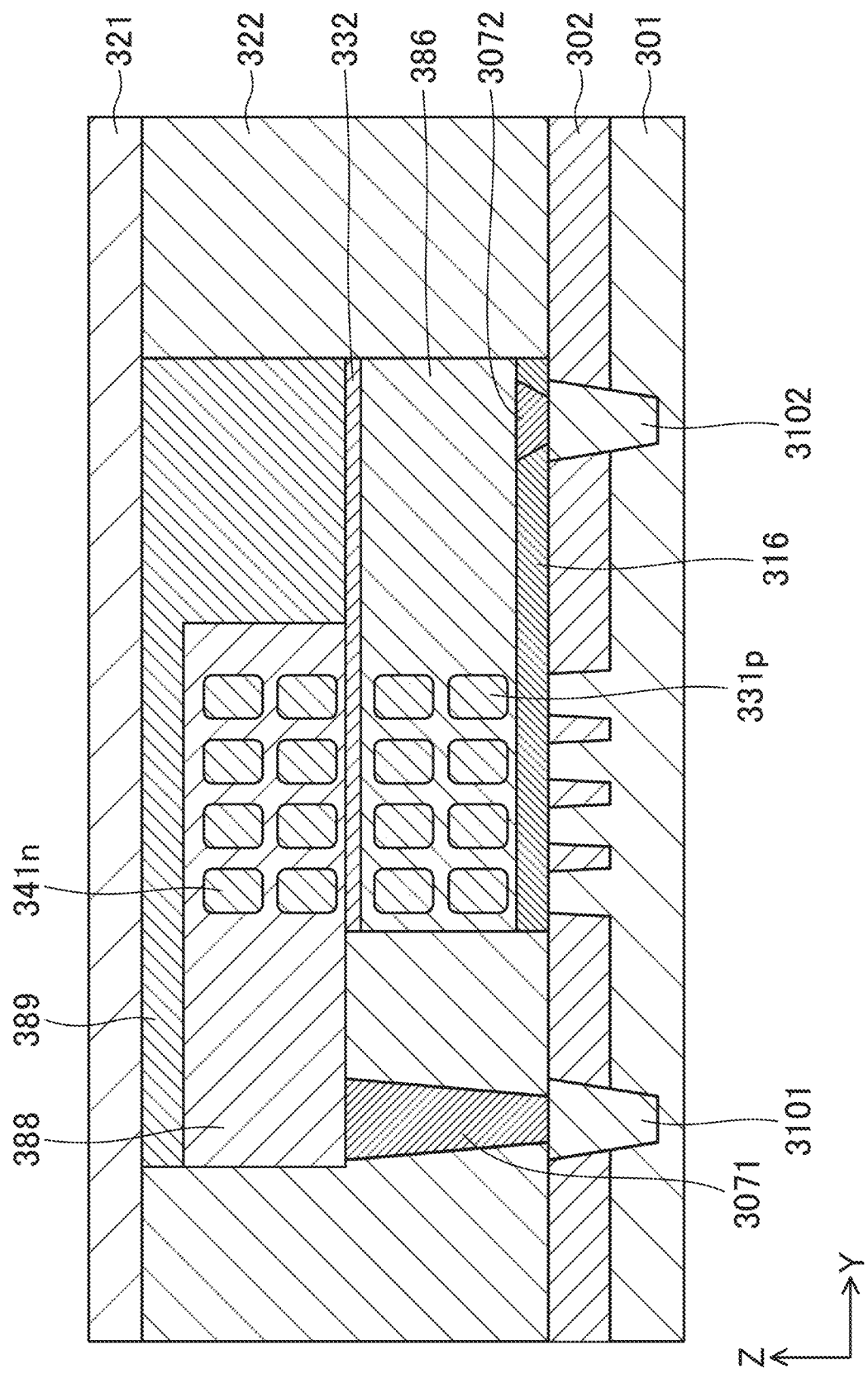
FIG. 12 is a cross-sectional view showing a configuration of a semiconductor device including a CFET.
Figure 13:
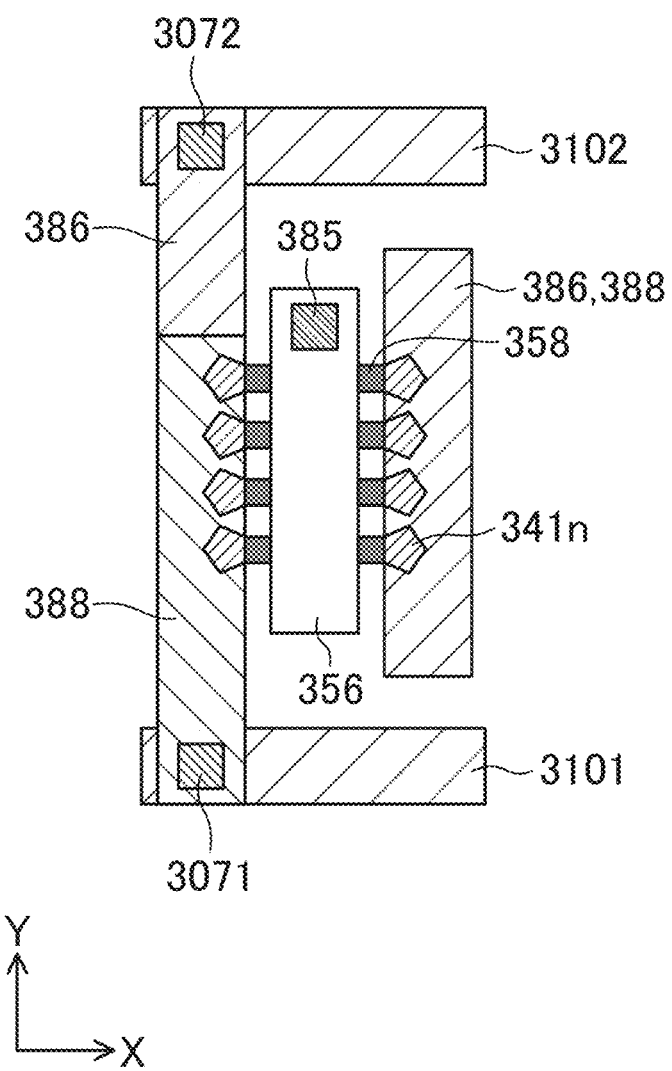
FIG. 13 is a cross-sectional view showing a configuration of a semiconductor device including a CFET.

First, the basic configuration of the CFET will be described. FIGS. 10 to 13 are views showing a configuration of a semiconductor device including a CFET. FIG. 10 is a cross-sectional view taken along the X direction. FIG. 11 is a cross-sectional view of a gate portion, taken along the Y direction. FIG. 12 is a cross-sectional view of a source/drain portion, taken along the Y direction. FIG. 13 is a plan view.

The X direction is a direction in which a nanowire extends. The Y direction is a direction in which a gate extends. The Z direction is the direction perpendicular to the substrate surface. Further, FIGS. 10 to 13 are each a schematic view, and dimensions, positions, and the like of the parts do not necessarily have to be consistent.

In this semiconductor device, an element isolation region 302 is formed on a surface of a semiconductor substrate 301 such as a silicon (Si) substrate. This element isolation region 302 defines an element active region 30a. In the element active region 30a, an N-type FET is formed on a P-type FET.

In the element active region 30a, a stacked transistor configuration 390a is formed on the semiconductor substrate 301. The stacked transistor configuration 390a includes a gate configuration 391 formed on the semiconductor substrate 301. The gate configuration 391 includes a gate electrode 356, a plurality of nanowires 358, gate insulating films 355, and insulating films 357. The gate electrode 356 extends in the Y direction and rises in the Z direction. The nanowires 358 penetrate the gate electrode 356 in the X direction and are aligned in the Y direction and the Z direction. Each of the gate insulating films 355 is formed between the gate electrode 356 and the nanowire 358. The gate electrode 356 and the gate insulating film 355 are formed at positions recessed in the X direction from both ends of the nanowire 358, and the insulating films 357 are formed at the recessed portions. On the semiconductor substrate 301, insulating films 316 are formed on a side of the insulating film 357 on both sides. Reference character 321 and 322 each denote an interlayer insulating film.

Further, as shown in FIG. 11, the gate electrode 356 is connected to a wire in an upper layer through a via 385 provided in an opening 375.

For example, the gate electrode 356 may be made of titanium, titanium nitride or polycrystalline silicon. For example, the gate insulating film 355 may be made of a high dielectric constant material such as hafnium oxide, aluminum oxide, or an oxide of hafnium and aluminum. For example, the nanowires 358 may be made of silicon, and the like. For example, the insulating film 316 and the insulating film 357 may be made of silicon oxide, silicon nitride, or the like.

In this semiconductor device, four nanowires 358 are aligned in the Z direction. In the element active region 30a, a P-type semiconductor layer 331p is formed at each end portion of two nanowires 358 closer to the semiconductor substrate 301. Two local interconnects 386 in contact with the P-type semiconductor layers 331p are formed so as to sandwich the gate configuration 391 in the X direction. Further, an N-type semiconductor layer 341n is formed to each end portion of two nanowires 358 far from the semiconductor substrate 101. Two local interconnects 388 in contact with the N-type semiconductor layers 341n are formed so as to sandwich the gate configuration 391 in the X direction. Between the local interconnects 386 and the local interconnects 388, insulating films 332 are formed. On the local interconnect 388, insulating films 389 are formed. For example, the P-type semiconductor layer 331p is a p-type SiGe layer, and the N-type semiconductor layer 341n is an n-type Si layer. For example, the insulating films 332 may be made of silicon oxide, silicon nitride, and the like.

Further, as shown in FIG. 12, the local interconnects 388 are connected to a buried line 3101 through a via 3071. The local interconnects 386 are connected to a buried line 3102 through a via 3072.

As described, the stacked transistor configuration 390a has the P-type FET including the gate electrode 356, the nanowires 358, the gate insulating films 355 and the P-type semiconductor layers 331p. In this P-type FET, each P-type semiconductor layer 331p on one side serves as the source region, and each P-type semiconductor layer 331p on the other side serves as the drain region. Each of the nanowires 358 serves as a channel. The stacked transistor configuration 390a also has the N-type FET including the gate electrode 356, the nanowires 358, the gate insulating films 355, and the N-type semiconductor layers 341n. In this N-type FET, each N-type semiconductor layer 341n on one side serves as the source region, and each N-type semiconductor layer 341n on the other side serves as the drain region. Each of the nanowires 358 serves as a channel.

As to the layers above the stacked transistor configuration, vias and metal wires provide wiring and the like between transistors, which is achievable by a known wiring process.

It should be noted that the number of nanowires in each of the P-type FET and the N-type FET is four in the Y direction and two in the Z direction, that is, eight in total. However, the number of nanowires is not limited to this. The number of nanowires in the P-type FET and that in the N-type FET may be different from each other.

Further, the semiconductor layer portion that is formed at each end of the nanowire and that constitutes a terminal to serve as the source or the drain of the transistor is referred to as "pad." In the above-described basic configuration of the CFET, the P-type semiconductor layer 331p and the N-type semiconductor layer 341n correspond to the pad.

Further, the plan views and cross-sectional views referenced in the description of embodiments below may omit insulating films. Further, the plan views and cross-sectional views referenced in the description of embodiments below may illustrate the nanowires and pads on both sides of the nanowires in the form of a simplified linear shape. Further, the expression "the same size" and the like in this specification indicating that the size and the like are the same encompasses a range of variation in manufacturing.

Further, the source and drain of the transistor is referred to as "node" of the transistor where appropriate in this specification. That is, one node of a transistor indicates the source or the drain of the transistor, and both nodes of a transistor indicate the source and the drain of the transistor.

Further, this specification basically deals with a case where a P-type FET and an N-type FET are stacked; however, there is a part where the P-type FET or the N-type FET is formed only in an upper layer (or a lower layer). As a formation method, for example, after a device of an upper layer (or a lower layer) is formed, a P-type FET or the N-type FET may be formed only in the upper layer (or the lower layer) by partially removing the device of the upper layer (or the lower layer) through, for example, removal of a pad portion or removal of a gate line or the pad portion. Alternatively, the P-type FET or the N-type FET may be formed only in an upper layer (or a lower layer) by partially not forming the upper layer (or the lower layer) at a time of forming the pad portion of the device in the upper layer (or the lower layer) through epitaxial growth.

Further, this specification basically deals with a case where a P-type FET and an N-type FET are stacked; however, there is a part where FETs of the identical conductive type (P-type FET or N-type FET) are formed in both an upper layer and a lower layer. That is, an FET of a different conductive type may be formed in at least one of the upper layer or the lower layer. As a formation method thereof, for example, in a case of forming an N-type FET (or a P-type FET) in a part of the upper layer (or the lower layer), a portion where the N-type FET (or the P-type FET) is formed is masked and the other portion is doped to the P-conductive type (or N-conductive type). Then, the portion other than the portion where the N-type FET is formed is masked, and the unmasked portion is doped to the N-conductive type (or P-conductive type). This way, an FET of a different conductive type is formed in at least one of the upper layer or the lower layer, and the FETs of the identical conductive type can be reliably stacked.

In the following embodiments, "VDD" and "VSS" are used to indicate a voltage or a power source itself.

Further, in the following embodiments and variations thereof, the same reference characters are used to represent equivalent elements, and the detailed explanation thereof will be omitted.

First Embodiment

Figure 1:
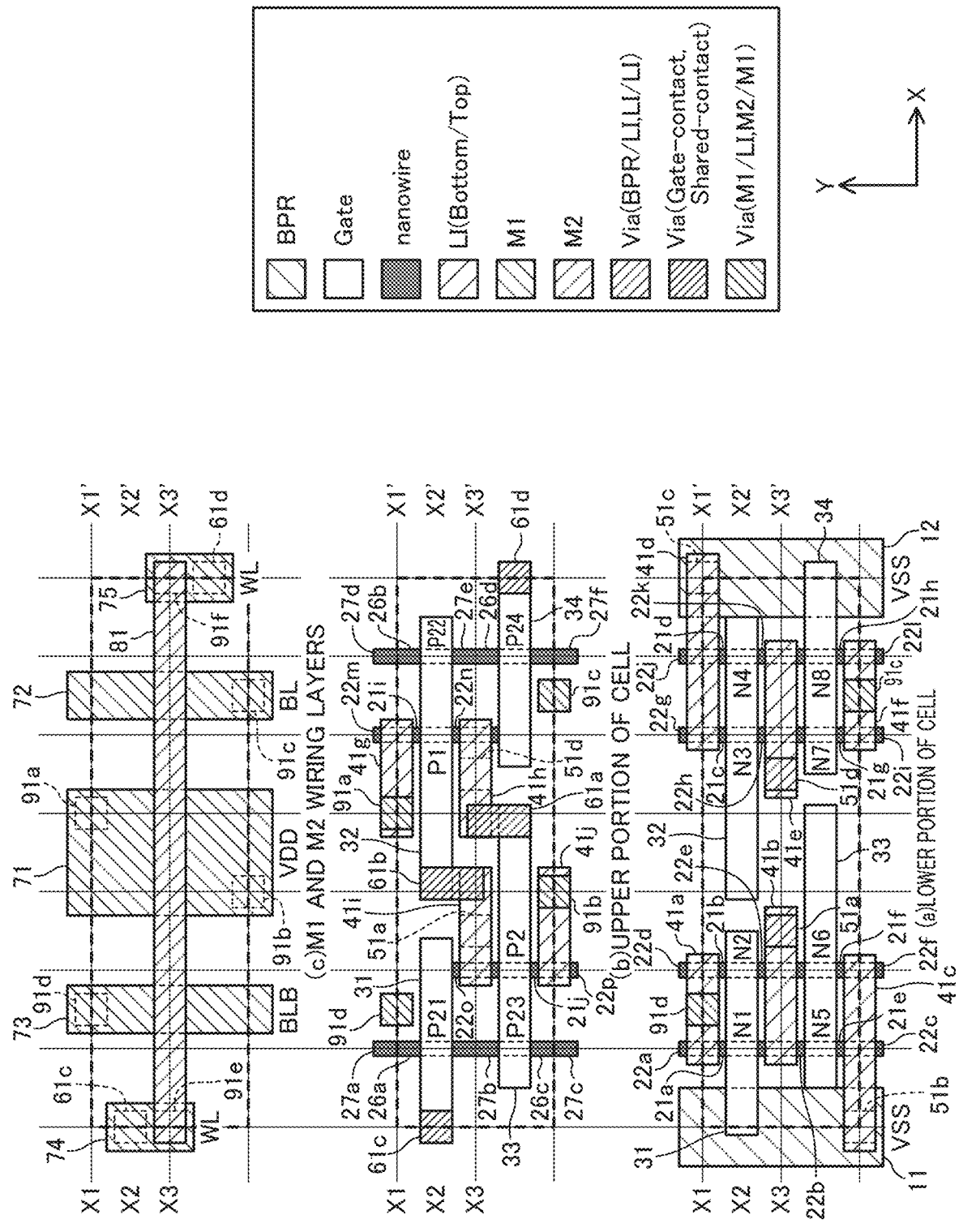
FIG. 1 is a plan view showing an exemplary layout configuration of a 1-port SRAM cell related to a first embodiment.
Figure 2:
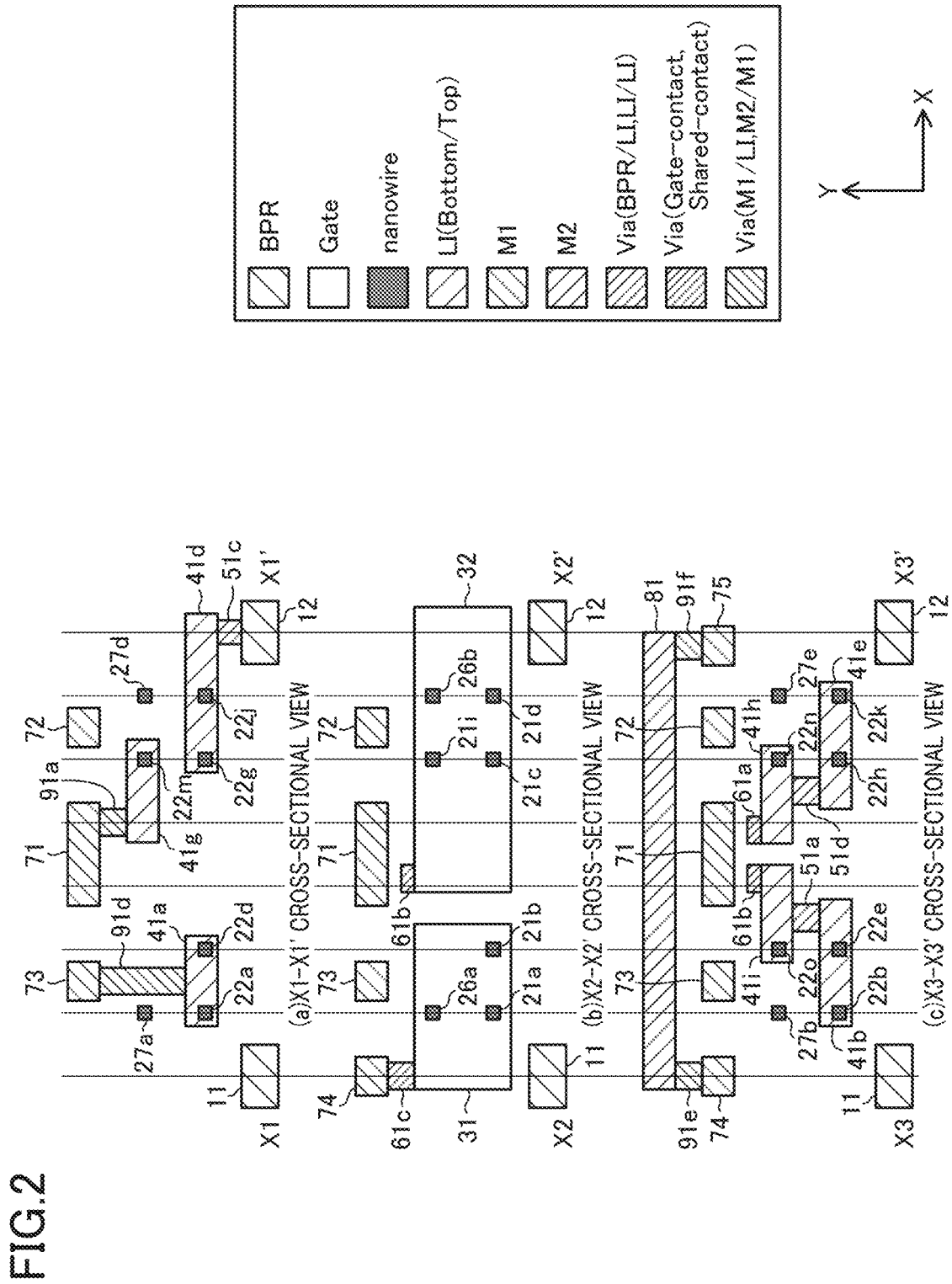
FIG. 2 is a cross-sectional view showing the exemplary layout configuration of the 1-port SRAM cell related to the first embodiment.

FIG. 1 and FIG. 2 are each a plan view showing an exemplary layout configuration of a 1-port SRAM cell related to a first embodiment, and illustrations (a) to (c) of FIG. 1 and illustrations (a) to (c) of FIG. 2 are each a cross-sectional view seen from a lateral direction in plan view. Specifically, the illustration (a) of FIG. 1 shows a portion including a three-dimensional transistor (here, an N-type nanowire FET) formed in the lower portion, that is, on the side closer to the substrate. The illustration (b) of FIG. 1 shows a portion including a three-dimensional transistor (here, a P-type nanowire FET) formed in the upper portion, that is, on the side distant from the substrate. The illustration (c) of FIG. 1 shows M1 and M2 wiring layers, that is, the metal wiring layers above the portion where the three-dimensional transistor is formed. The illustration (a) of FIG. 2 is a cross section taken along line X1-X1', the illustration (b) of FIG. 2 is a cross section taken along line X2-X2', and the illustration (c) of FIG. 2 is a cross section taken along line X3-X3'.

Figure 3:
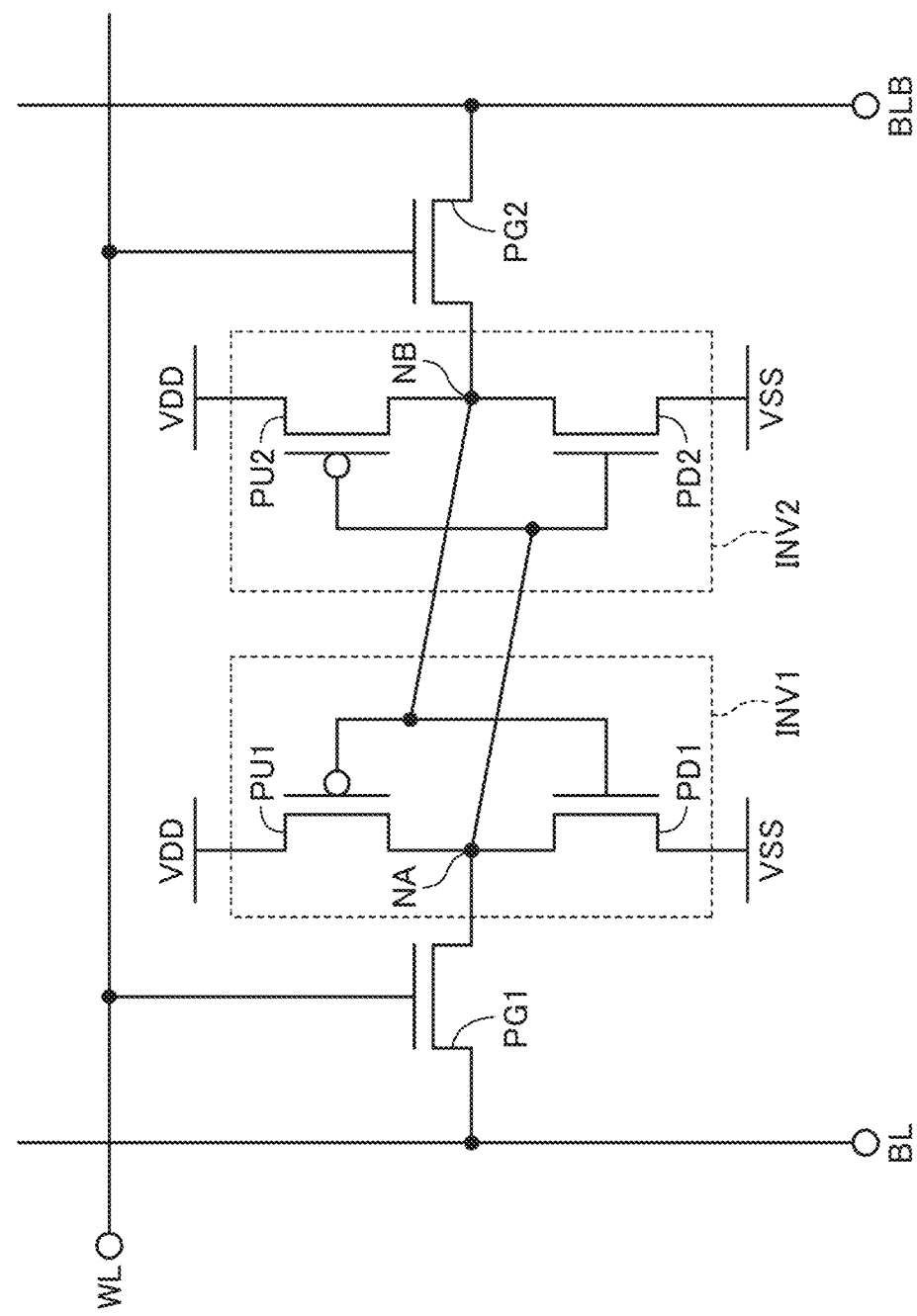
FIG. 3 is a circuit diagram showing a configuration of the 1-port SRAM cell related to the first embodiment.

FIG. 3 is a circuit diagram showing a configuration of the 1-port SRAM cell related to the first embodiment. In the 1-port SRAM cell, a 1-port SRAM circuit including load transistors PU1 and PU2, drive transistors PD1 and PD2, and access transistors PG1 and PG2 is configured as illustrated in FIG. 3. The load transistors PU1 and PU2 are each a P-type FET. The drive transistors PD1 and PD2 and the access transistors PG1 and PG2 are each an N-type FET.

The load transistor PU1 is provided between a power source VDD and a first node NA, and the drive transistor PD1 is provided between the first node NA and a power source VSS. The load transistor PU1 and the drive transistor PD1 have their gates connected to a second node NB to configure an inverter INV1. The load transistor PU2 is provided between the power source VDD and the second node NB, and the drive transistor PD2 is provided between the second node NB and the power source VSS. The load transistor PU2 and the drive transistor PD2 have their gates connected to the first node NA to configure an inverter INV2. That is, an output of one of the inverters is connected to an input of the other inverter, thereby configuring a latch.

The access transistor PG1 is provided between a bit line BL and the first node NA, and the gate thereof is connected to a word line WL. The access transistor PG2 is provided between a bit line BLB and the second node NB, and the gate thereof is connected to the word line WL. The bit lines BL and BLB constitute a complementary bit line pair.

In the 1-port SRAM circuit, while the bit lines BL and BLB constituting the complementary bit line pair are driven to a high level and a low level, respectively, driving the word line WL to the high level causes the high level to be written to the first node NA and the low level to the second node NB. On the other hand, while the bit lines BL and BLB are driven to the low level and a high level, respectively, driving the word line WL to the high level causes the low level to be written to the first node NA and the high level to the second node NB. Then, while data is written to the first and second nodes NA and NB, driving the word line WL to the low level determines a latch state and retains the data written to the first and second nodes NA and NB.

Further, with the bit lines BL and BLB are pre-charged in advance to the high level, driving the word line WL to the high level determines the state of each of the bit lines BL and BLB according to the data written to the first and second nodes NA and NB, and data can be read out from the SRAM cell. Specifically, when the first node NA is at the high level and the second node NB is at the low level, the bit line BL is held at the high level and the bit line BLB is discharged to the low level. On the other hand, when the first node NA is at the low level and the second node NB is at the high level, the bit line BL is discharged to the low level and the bit line BLB is held at the high level.

As described above, the 1-port SRAM cell has functions of writing data to the SRAM cell, retaining data, and reading out data from the SRAM cell by controlling the bit lines BL and BLB and the word line WL.

It should be noted that, in the following description, the lateral direction of the figure in the plan view of FIG. 1 or the like is the X direction, the longitudinal direction is Y direction, and a direction perpendicular to the substrate surface is the Z direction. Further, solid lines running longitudinally and laterally in the plan view of FIG. 1 and solid lines running longitudinally in the cross-sectional view of FIG. 2 and the like illustrate a grid used for arranging components at the time of designing. Cells of the grid are arranged at equal intervals in the X direction, and arranged at equal intervals in the Y direction. It should be noted that the intervals of the cells in the X direction and those in the Y direction may be the same or different. Further, the intervals of the cells may be different in each layer. Further, each part does not necessarily have to be arranged on the grid. However, for the sake of reducing manufacturing-attributed variations, the parts are arranged on the grid in one preferred embodiment.

Further, the dotted lines surrounding the cell in the plan view of FIG. 1 and the like indicate a cell frame of the 1-port SRAM cell (outer edge of the 1-port SRAM cell). The 1-port SRAM cell is arranged so that its cell frame contacts with a cell frame of an adjacent cell in the X direction or Y direction.

Further, in FIG. 1 and the like, in a case where the 1-port SRAM cells are arranged adjacent to each other in the X direction, the 1-port SRAM cells are arranged so as to be inverted in the X direction. Further, in a case where the 1-port SRAM cells are arranged adjacent to each other in the Y direction, the 1-port SRAM cells are arranged so as to be inverted in the Y direction.

As shown in the illustration (a) of FIG. 1, the cell has, at both left and right ends of its lower portion, power supply lines 11 and 12 extending in the Y direction. Both of the power supply lines 11 and 12 are each buried power rail (BPR) formed in a buried wiring layer. The power supply lines 11 and 12 supply the same power supply voltage VSS. In FIG. 1, the transistors P1 and P2 correspond to load transistors PU1 and PU2, respectively. The transistors N3 and N4 correspond to the drive transistor PD1. The transistors N5 and N6 correspond to the drive transistor PD2. The transistors N7 and N8 correspond to the access transistor PG1. The transistors N1 and N2 correspond to the access transistor PG2.

Nanowires 21a to 21h extending in the Y direction are formed in the lower portion of the cell, and nanowires 21i, 21j, 26a to 26d extending in the Y direction are formed in the upper portion of the cell.

Further, the nanowires 21a to 21d are formed so as to align in the X direction. The nanowires 21e to 21h are formed so as to align in the X direction. The nanowires 21i, 26a, and 26b are formed so as to align in the X direction. The nanowires 21j, 26c, and 26d are formed so as to align in the X direction.

Further, the nanowires 21a to 21d, 26a, 26b are formed so as to align with the nanowires 21e to 21h, 26c, and 26d in the Y direction, respectively.

The nanowires 21a, 21c to 21f, and 21h overlap nanowires 26a, 21i, 26b, 26c, 21j, and 26d, respectively, in plan view.

Gate lines (Gate) 31 to 34 each extend in the Z direction from the lower portion to the upper portion of the cell, and extend in the X direction. The gate lines 31 and 32 are arranged side by side in the X direction, and the gate lines 33 to 34 are arranged side by side in the X direction. The gate line 31 serves as gates of the transistors N1 and N2, and a dummy transistor P21. The gate line 32 serves as gates of the transistors N3, N4, and P1, and a dummy transistor P22. The gate line 33 serves as gates of the transistors N5, N6, and P2, and a dummy transistor P23. The gate line 34 serves as gates of the transistors N7 and N8, and a dummy transistor P24.

Pads 22a to 22l doped to the N-type semiconductor are formed at the upper end of the nanowire 21a in the figure, between the nanowires 21a and 21e, at the lower end of the nanowire 21e in the figure, at the upper end of the nanowire 21b in the figure, between the nanowires 21b and 21f, at the lower end of the nanowire 21f in the figure, at the upper end of the nanowire 21c in the figure, between the nanowires 21c and 21g, at the lower end of the nanowire 21g in the figure, at the upper end of the nanowire 21d in the figure, between the nanowires 21d and 21h, and at the lower end of the nanowire 21h in the figure, respectively. The nanowires 21a to 21h constitute channel portions of the transistors N1 to N8, respectively. The pads 22a and 22b constitute a node of the transistor N1. The pads 22d and 22e constitute a node of the transistor N2. The pads 22g and 22h constitute a node of the transistor N3. The pads 22j and 22k constitute a node of the transistor N4. The pads 22b and 22c constitute a node of the transistor N5. The pads 22e and 22f constitute a node of the transistor N6. The pads 22h and 22i constitute a node of the transistor N7. The pads 22k and 22l constitute a node of the transistor N8.

That is, the nanowire 21a, the gate line 31, and the pads 22a and 22b constitute the transistor N1. The nanowire 21b, the gate line 31, and the pads 22d and 22e constitute the transistor N2. The nanowire 21c, the gate line 32, and the pads 22g and 22h constitute the transistor N3. The nanowire 21d, the gate line 32, and the pads 22j and 22k constitute the transistor N4. The nanowire 21e, the gate line 33, and the pads 22b and 22c constitute the transistor N5. The nanowire 21f, the gate line 33, and the pads 22e and 22f constitute the transistor N6. The nanowire 21g, the gate line 34, and the pads 22h and 22i constitute the transistor N7. The nanowire 21h, the gate line 34, and the pads 22k and 22l constitute the transistor N8.

Pads 22m to 22p doped to the P-type semiconductor are formed at the upper end of the nanowire 21i in the figure, at the lower end of the nanowire 21i in the figure, at the upper end of the nanowire 21j in the figure, and at the lower end of the nanowire 21j in the figure, respectively. The nanowires 21i and 21j constitute channel portions of the transistors P1 and P2, respectively. The pads 22m and 22n constitute a node of the transistor P1. The pads 22o and 22p constitute a node of the transistor P2.

That is, the nanowire 21i, the gate line 32, and the pads 22m and 22n constitute the transistor P1. The nanowire 21j, the gate line 33, and the pads 22o and 22p constitute the transistor P2.

Dummy pads 27a to 27f doped to the P-type semiconductor are formed at the upper end of the nanowire 26a in the figure, between the nanowires 26a and 26c, at the lower end of the nanowire 26c in the figure, at the upper end of the nanowire 26b in the figure, between the nanowires 26b and 26d, and at the lower end of the nanowire 26d in the figure, respectively. The dummy pads 27a and 27b constitute a node of the dummy transistor P21. The dummy pads 27d and 27e constitute a node of the dummy transistor P22. The dummy pads 27b and 27c constitute a node of the dummy transistor P23. The dummy pads 27e and 27f constitute a node of the dummy transistor P24. The nanowires 26a to 26d constitute channel portions of the dummy transistors P21 and P24, respectively. The dummy transistors P21 to P24 are transistors having no logic function. Further, the dummy transistors P21 to P24 are omitted in the circuit diagram of FIG. 3. Note that some of the embodiments and variation thereof described below include dummy transistors in the 1-port SRAM cells; however, illustrations of the dummy transistors in the circuit diagram are omitted, as each dummy transistor has no effect on the logic function of the 1-port SRAM cells.

Therefore, transistors N1, N3 to N6, and N8 overlap the dummy transistor P21, the transistor P1, the dummy transistors P22 and P23, the transistor P2, and the dummy transistor P24, respectively, in plan view.

Further, the transistors N1 to N4 are formed so as to align in the X direction. The transistors N5 to N8 are formed so as to align in the X direction. The transistor P1 and the dummy transistors P21 and P22 are formed so as to align in the X direction. The transistor P2 and the dummy transistors P23 and P24 are formed so as to align in the X direction.

Further, the transistors N1 to N4 and the dummy transistors P21 and P22 are formed so as to align with the transistors N5 to N8 and the dummy transistors P23 and P24, respectively, in the Y direction.

As shown in the illustration (a) of FIG. 1, local interconnects 41a to 41f extended in the X direction are formed in the lower portion of the cell. The local interconnect 41a is connected to the pads 22a and 22d. The local interconnect 41b is connected to the pads 22b and 22e. The local interconnect 41c is connected to the pads 22c and 22f. The local interconnect 41d is connected to the pads 22g and 22j. The local interconnect 41e is connected to the pads 22h and 22k. The local interconnect 41f is connected to the pads 22i and 22l.

That is, the transistors N1 and N2 have their pads connected to each other via a local interconnect, and share a gate line. The transistors N3 and N4 have their pads connected to each other via a local interconnect, and share a gate line. The transistors N5 and N6 have their pads connected to each other via a local interconnect, and share a gate line. The transistors N7 and N8 have their pads connected to each other via a local interconnect, and share a gate line. Further, the transistors N1 and N2 correspond to the access transistor PG2. The transistors N3 and N4 correspond to the drive transistor PD1. The transistors N5 and N6 correspond to the drive transistor PD2. The transistors N7 and N8 correspond to the access transistor PG1. Therefore, in the 1-port SRAM cell related to the present embodiment, the drive transistors PD1 and PD2, and the access transistors PG1 and PG2 are each configured by two N-type FETs connected in parallel.

As shown in the illustration (b) of FIG. 1, local interconnects 41g to 41j extended in the X direction are formed in the upper portion of the cell. The local interconnect 41g is connected to a pad 22m. The local interconnect 41h is connected to a pad 22n. The local interconnect 41i is connected to a pad 22o. The local interconnect 41j is connected to a pad 22p.

The local interconnect 41b is connected to the local interconnect 41i through a contact (via) 51a. The local interconnect 41c is connected to the power supply line 11 through a contact 51b. The local interconnect 41d is connected to the power supply line 12 through a contact 51c. The local interconnect 41e is connected to the local interconnect 41h through a contact 51d.

The local interconnect 41h is connected to the gate line 33 through a shared-contact 61a. The local interconnect 41i is connected to the gate line 32 through a shared-contact 61b. Note that the local interconnects 41e and 41h, the contact 51d, the shared-contact 61a and the gate line 33 correspond to the first node NA, and the local interconnects 41b and 41i, the contact 51a, the shared-contact 61b and the gate line 32 correspond to the second node NB.

As shown in the illustration (c) of FIG. 1, lines 71 to 73 extended in the Y direction from the upper end to the lower end of the cell are formed in the M1 wiring layer that is a metal wiring layer. Further, lines 74 and 75 are formed. The line 71 supplies the voltage VDD. The lines 72 and 73 correspond to the bit lines BL and BLB, respectively.

A line 81 extended in the X direction from the left end to the right end of the cell is formed in the M2 wiring layer that is a layer above the M1 wiring layer. The line 81 corresponds to the word line WL.

The line 71 is connected to the local interconnect 41g through a contact 91a, and connected to the local interconnect 41j through a contact 91b. The line 72 is connected to the local interconnect 41f through a contact 91c. The line 73 is connected to the local interconnect 41a through a contact 91d. The line 74 is connected to the gate line 31 through a contact (gate-contact) 61a, and connected to the line 81 through a contact 91e. The line 75 is connected to the gate line 34 through a contact 61d, and connected to the line 81 through a contact 91f. That is, the line 81 is connected to the gate line 31 through the contact 91e, the line 74, and the contact 61c, and connected to the gate line 34 through the contact 91f, the line 75, and the contact 61d.

With the above configuration, in the transistor P1 (load transistor PU1), the pad 22m is connected to the line 71 that supplies the voltage VDD, the pad 22n is connected to the local interconnect 41h (first node NA), and the gate line 32 is connected to the shared-contact 61b (second node NB). In the transistor P2 (load transistor PU2), the pad 22p is connected to the line 71 that supplies the voltage VDD, the pad 22o is connected to the local interconnect 41i (second node NB), and the gate line 33 is connected to the shared-contact 61a (first node NA). In the transistors N3 and N4 (drive transistor PD1), the pads 22h and 22k are connected to the local interconnect 41e (first node NA), the pads 22g and 22j are connected to the power supply line 12 that supplies the voltage VSS, and the gate line 32 is connected to the shared-contact 61b (second node NB). In the transistors N5 and N6 (drive transistor PD2), the pads 22b and 22e are connected to the local interconnect 41b (second node NB), the pads 22c and 22f are connected to the power supply line 11 that supplies the voltage VSS, and the gate line 33 is connected to the shared-contact 61a (first node NA). In the transistors N7 and N8 (access transistor PG1), the pads 22i and 22l are connected to the line 72 (bit line BL), the pads 22h and 22k are connected to the local interconnect 41e (first node NA), and the gate line 34 is connected to the line 81 (word line WL). In the transistors N1 and N2 (access transistor PG2), the pads 22a and 22d are connected to the line 73 (bit line BLB), the pads 22b and 22e are connected to the local interconnect 41b (second node NB), and the gate line 31 is connected to the line 81 (word line WL).

That is, the transistors N1 to N8, P1, and P2 form a 1-port SRAM circuit. Each of the transistors N1 to N8, P1, and P2 is a three-dimensional transistor.

Further, the transistors P1 and P2 correspond to the load transistors PU1 and PU2, respectively. The transistors N1 and N2 connected in parallel correspond to the access transistor PG2. The transistors N3 and N4 connected in parallel correspond to the drive transistor PD1. The transistors N5 and N6 connected in parallel correspond to the drive transistor PD2. The transistors N7 and N8 connected in parallel correspond to the access transistor PG1. That is, each of the load transistors PU1 and PU2 is configured by a single transistor, and the drive transistors PD1 and PD2 and the access transistors PG1 and PG2 are each configured by two transistors connected in parallel. Therefore, the number of transistors constituting the load transistor PU1 and the number of transistors constituting the load transistor PU2 are smaller than the number of transistors constituting the drive transistor PD1 and smaller than the number of transistors constituting the drive transistor PD2, respectively.

This way, it is possible to achieve a layout configuration of a 1-port SRAM cell using a CFET, in which six transistors (the load transistors PU1 and PU2, the drive transistors PD1 and PD2, and the access transistors PG1 and PG2) constituting a 1-port SRAM circuit of the 1-port SRAM cell are configured by different numbers of nanowire transistors. As a result, the operation speed and the operation stability of the semiconductor memory device can be improved.

Further, the transistors P1 and P2 overlap the transistors N3 and N6, respectively, in plan view. That is, the transistors P1 and P2 are stacked on the transistors N3 and N6, respectively. This way, the area of the 1-port SRAM cell can be reduced.

Further, the drive transistors PD1 and PD2 and the access transistors PG1 and PG2 are each configured by two transistors connected in parallel. As a result, it is possible to facilitate reading data from the 1-port SRAM cell and writing data to the 1-port SRAM cell, and to raise the operation speed of the semiconductor memory device.

Further, the transistors N1 to N8 are formed in the lower portion of the cell, and transistors P1 and P2 and the dummy transistors P21 to P24 are formed in the upper portion of the cell. That is, only the N-type FETs are formed in the lower portion of the cell, and only the P-type FETs including the dummy transistors are formed in the upper portion of the cell. This keeps the manufacturing process from being complicated.

Note that none of the nodes of the dummy transistors P21 to P24 are connected to the local interconnects. Therefore, the dummy transistors P21 to P24 do not affect the logic function of the 1-port SRAM cells. Further, the dummy transistors P21 to P24 do not have to be formed in the 1-port SRAM cell of the present embodiment. However, by forming the dummy transistors P21 to P24, it is possible to suppress manufacturing-attributed variations of the semiconductor memory devices, and improve the yield and the reliability of the semiconductor memory devices.

Further, the shared-contact 61a connecting the local interconnect 41h to the gate line 33 and the shared-contact 61b connecting the local interconnect 41i to the gate line 32 may be formed in the same process as the process of forming the contacts 61c and 61d connecting the lines arranged in the M1 wiring layer to the gate lines, or may be formed in a different process.

Further, although the line 71 that supplies the voltage VDD is provided in the M1 wiring layer, the power supply line that supplies the voltage VDD may be provided in the buried wiring layer. Further, the power supply line that supplies the voltage VDD may be provided in both the M1 wiring layer and the buried wiring layer. In this case, since the power source that supplies the voltage VDD is strengthened, the power source can be stabilized.

(Variation 1)

Figure 4:
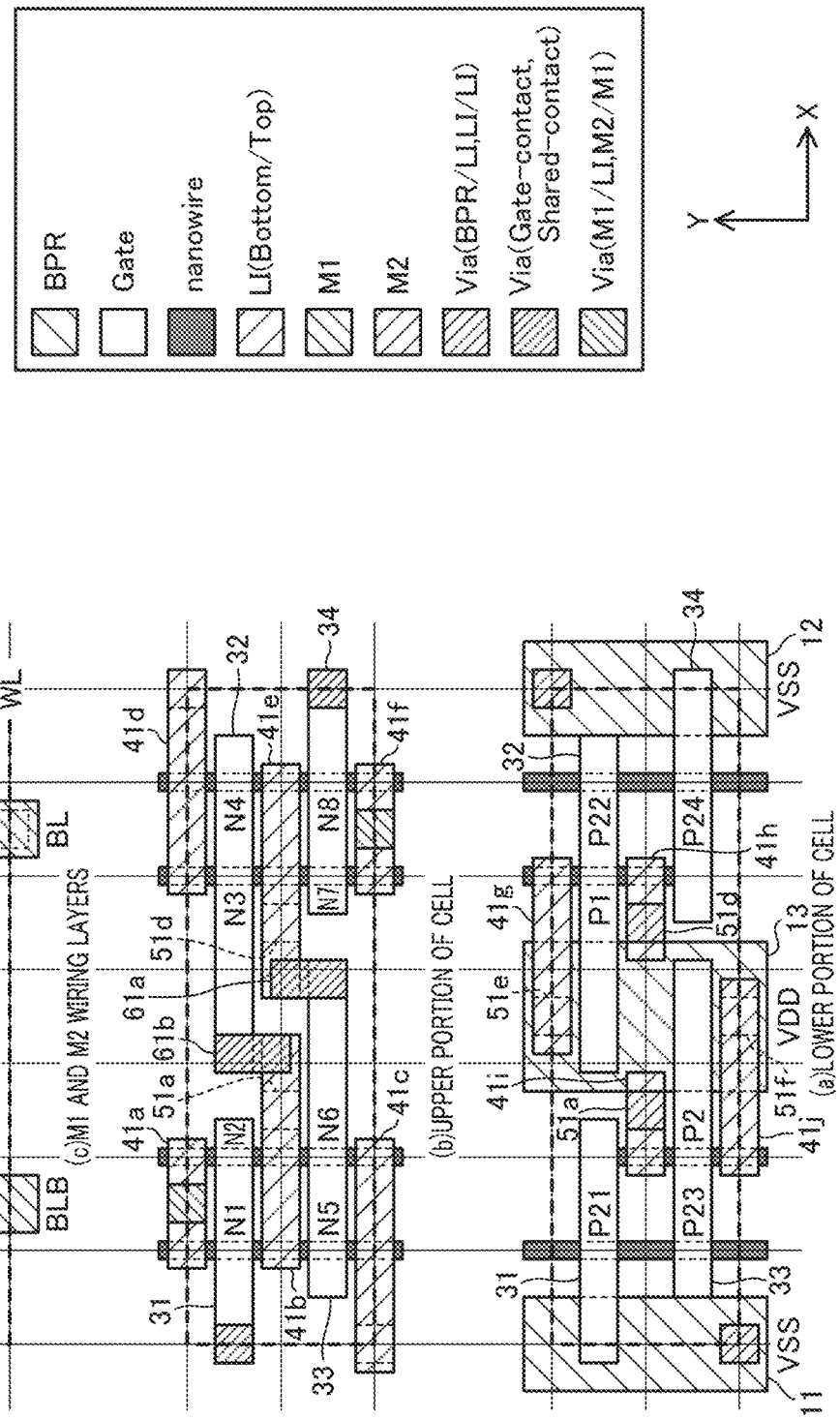
FIG. 4 is a plan view showing another exemplary layout configuration of the 1-port SRAM cell related to the first embodiment.

FIG. 4 is a plan view showing another exemplary layout configuration of the 1-port SRAM cell related to the first embodiment. Specifically, an illustration (a) of FIG. 4 shows a lower part of the cell, an illustration (b) of FIG. 4 shows an upper part of the cell, and an illustration (c) of FIG. 4 shows M1 and M2 wiring layers. In FIG. 4, N-type FETs are formed in the upper portion of the cell, and P-type FETs are formed in the lower portion of the cell. That is, in FIG. 4, the conductive types of the transistors formed in the upper portion and the lower portion of the cell are reversed from those of the 1-port SRAM cell shown in FIG. 1.

Specifically, transistors N1 to N8 and local interconnects 41a to 41f are formed in the upper portion of the cell, and transistors P1 and P2, and dummy transistors P21 to P24 and local interconnects 41g to 41j are formed in the lower portion of the cell.

Further, a power supply line 13 extended in the Y direction is formed in the buried wiring layer. The power supply line 13 supplies the voltage VDD.

The local interconnect 41g is connected to the power supply line 13 through a contact 51e, and the local interconnect 41j is connected to the power supply line 13 through a contact 51f.

The local interconnect 41i is connected to a gate line 32 through a contact 51a, the local interconnect 41b, and a shared-contact 61b. The local interconnect 41h is connected to a gate line 33 through a contact 51d, the local interconnect 41e, and a shared-contact 61a.

This variation brings about effects similar to those of the 1-port SRAM cell related to the first embodiment.

(Variation 2)

Figure 5:
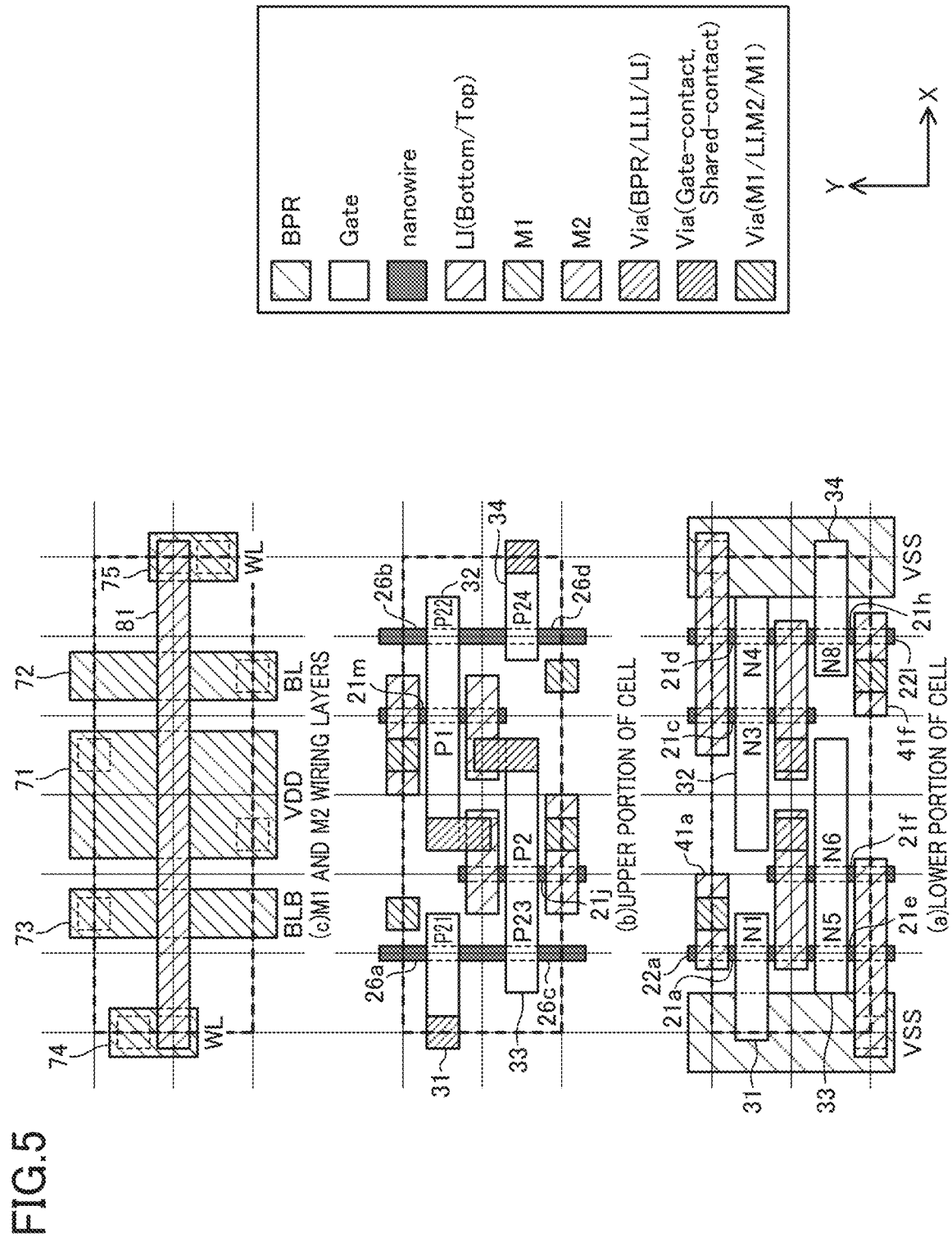
FIG. 5 is a plan view showing another exemplary layout configuration of the 1-port SRAM cell related to the first embodiment.

FIG. 5 is a plan view showing another exemplary layout configuration of the 1-port SRAM cell related to the first embodiment. Specifically, an illustration (a) of FIG. 5 shows a lower part of the cell, an illustration (b) of FIG. 5 shows an upper part of the cell, and an illustration (c) of FIG. 5 shows M1 and M2 wiring layers. In FIG. 5, transistors N2 and N7 are not formed in the lower portion of the cell as compared to FIG. 1. That is, in FIG. 5, each of the access transistors PG1 and PG2 is configured by a single transistor.

Specifically, nanowires 21b and 21g and pads 22d and 22i are not formed in the lower part of the cell. Further, a local interconnect 41a is connected to a pad 22a, and a local interconnect 41f is connected to a pad 22l.

This variation brings about effects similar to those of the 1-port SRAM cell related to the first embodiment.

Further, transistors N1, N3 to N6, and N8 overlap the dummy transistor P21, the transistor P1, the dummy transistors P22 and P23, the transistor P2, and the dummy transistor P24, respectively, in plan view. That is, since each transistor is stacked with another transistor, there is no need for, for example, partially removing the transistors. This keeps the manufacturing process from being complicated.

Note that the transistors N1, N3 to N6, and N8 are formed in the upper portion of the cell, and transistors P1 and P2 and the dummy transistors P21 to P24 are formed in the lower portion of the cell. That is, the conductive types of the transistors formed in the upper portion and the lower portion of the cell may be reversed. In this case, in the 1-port SRAM cell, local interconnects, contacts and the like are formed so as to configure a 1-port SRAM circuit.

Second Embodiment

Figure 6:
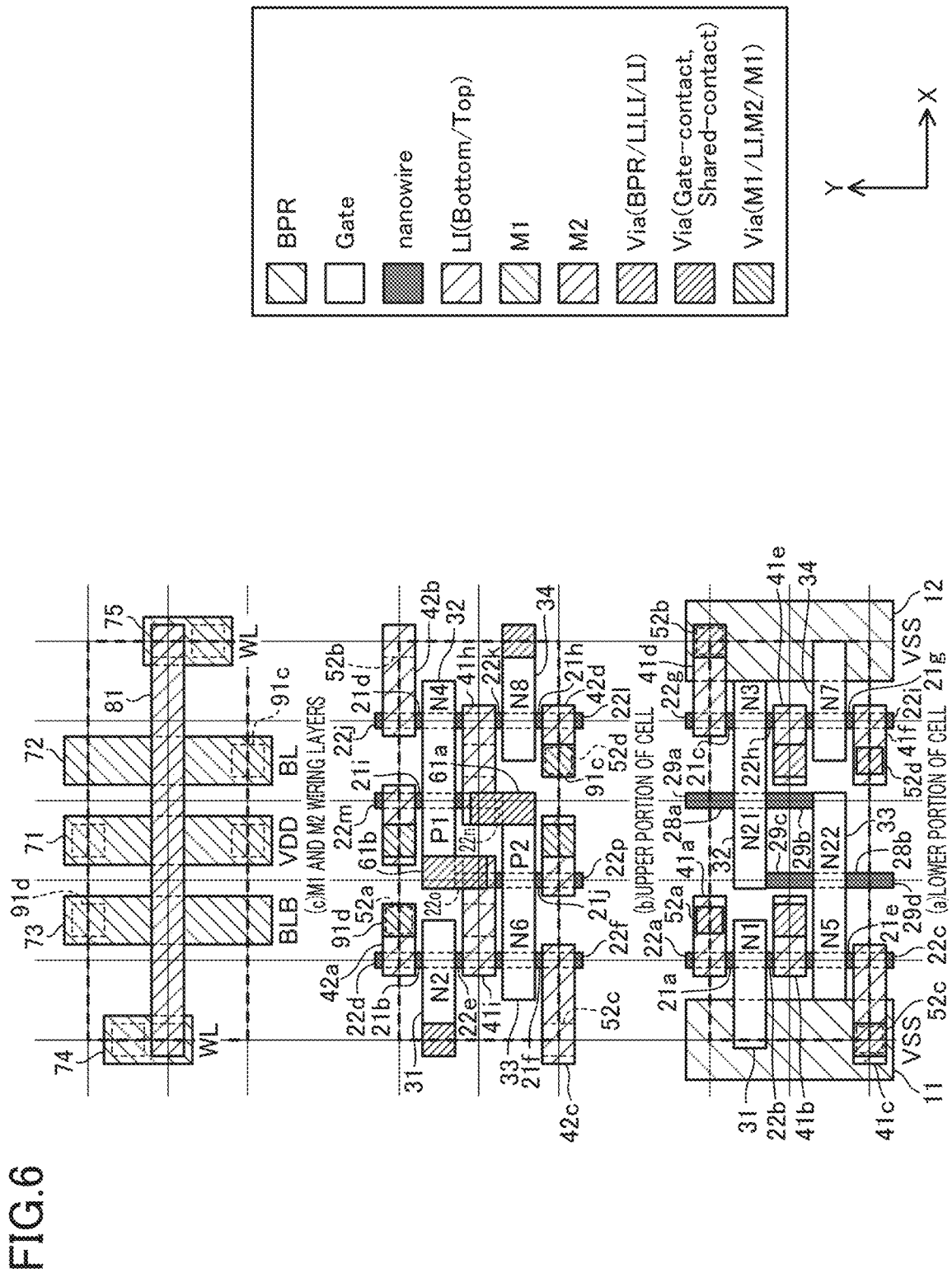
FIG. 6 is a plan view showing an exemplary layout configuration of the 1-port SRAM cell related to a second embodiment.

FIG. 6 is a plan view showing another exemplary layout configuration of the 1-port SRAM cell related to the second embodiment. Specifically, an illustration (a) of FIG. 6 shows a lower part of the cell, an illustration (b) of FIG. 6 shows an upper part of the cell, and an illustration (c) of FIG. 6 shows M1 and M2 wiring layers. In the 1-port SRAM cell related to the second embodiment, transistors N1, N3, N5, and N7 and dummy transistors N21 and N22 are formed in the lower portion of the cell, and transistors N2, N4, N6, N8, P1, and P2 are formed in the upper portion of the cell. In FIG. 6, the transistors P1 and P2 correspond to load transistors PU1 and PU2, respectively. The transistors N3 and N4 correspond to the drive transistor PD1. The transistors N5 and N6 correspond to the drive transistor PD2. The transistors N7 and N8 correspond to the access transistor PG1. The transistors N1 and N2 correspond to the access transistor PG2.

Specifically, nanowires 21a, 21c, 21e and 21g are formed in the lower part of the cell. In the lower portion of the cell, nanowires 28a and 28b extending in the Y direction are formed. Nanowires 21b, 21d, 21f, 21h, 21i, and 21j are formed in the upper portion of the cell.

The nanowires 21a, 21c, and 28a are formed so as to align in the X direction. The nanowires 21e, 21g, and 28b are formed so as to align in the X direction. The nanowires 21b, 21d, and 21i are formed so as to align in the X direction. The nanowires 21f, 21h, and 21j are formed so as to align in the X direction.

Further, the nanowires 21a to 21d are formed so as to align with the nanowires 21e to 21h in the Y direction, respectively.

Further, the nanowires 21a, 21c, 21e, 21g, 28a, and 28b overlap nanowires 21b, 21d, 21f, 21h, 21i, and 21j respectively, in plan view.

A gate line 32 serves as the gate of a dummy transistor N21, and a gate line 33 serves as the gate of a dummy transistor N22. Dummy pads 29a to 29d doped to the N-type semiconductor are formed at the upper end of the nanowire 28a in the figure, at the lower end of the nanowire 28a in the figure, at the upper end of the nanowire 28b in the figure, and at the lower end of the nanowire 28b in the figure, respectively. The nanowires 28a and 28b constitute channel portions of the dummy transistors N21 and N22, respectively. The dummy pads 29a and 29b constitute a node of the dummy transistor N21, and the dummy pads 29c and 29d constitute a node of the dummy transistor N22. The dummy transistors N21 and N22 are transistors having no logic function.

Therefore, transistors N1, N3, N5, and N7 and the dummy transistors N21, and N22 overlap the transistors N2, N4, N6, N8, P1, and P2, respectively, in plan view.

Further, the transistors N1 and N3 and the dummy transistor N21 are formed so as to align in the X direction. The transistors N5 and N7 and the dummy transistor N22 are formed so as to align in the X direction. The transistors N2, N4, and P1 are formed so as to align in the X direction. The transistors N6, N8, and P2 are arranged in the X direction.

A local interconnect 41a is connected to a pad 22a in the lower portion of the cell. A local interconnect 41b is connected to a pad 22b. A local interconnect 41c is connected to a pad 22c. A local interconnect 41d is connected to a pad 22g. A local interconnect 41e is connected to a pad 22h. A local interconnect 41f is connected to a pad 22i.

Local interconnects 42a and 42d extending in the X direction are formed in the upper portion of the cell. The local interconnect 42a is connected to a pad 22d. The local interconnect 42b is connected to a pad 22j. The local interconnect 42c is connected to a pad 22f. The local interconnect 42d is connected to a pad 22l. The local interconnect 41i is connected to pads 22e and 22o. The local interconnect 41h is connected to pads 22n and 22k.

The local interconnect 42a is connected to the local interconnect 41a through a contact 52a, and connected to a line 73 through a contact 91d. The local interconnect 42b is connected to the local interconnect 41d through a contact 52b. The local interconnect 42c is connected to the local interconnect 41c through a contact 52c. The local interconnect 42d is connected to the local interconnect 41f through a contact 52d, and connected to a line 72 through a contact 91c.

That is, the transistors N1 and N2 have their pads connected to each other through a local interconnect and a contact, and share a gate line. The transistors N3 and N4 have their pads connected to each other through a local interconnect and a contact, and share a gate line. The transistors N5 and N6 have their pads connected to each other through a local interconnect and a contact, and share a gate line. The transistors N7 and N8 have their pads connected to each other through a local interconnect and a contact, and share a gate line. Further, the transistors N1 and N2 correspond to the access transistor PG2. The transistors N3 and N4 correspond to the drive transistor PD1. The transistors N5 and N6 correspond to the drive transistor PD2. The transistors N7 and N8 correspond to the access transistor PG1. Therefore, in the 1-port SRAM cell related to the present embodiment, the drive transistors PD1 and PD2, and the access transistors PG1 and PG2 are each configured by two N-type FETs connected in parallel.

With the above configuration, in the transistor P1 (load transistor PU1), the pad 22m is connected to the line 71 that supplies the voltage VDD, the pad 22n is connected to the local interconnect 41h (first node NA), and the gate line 32 is connected to the shared-contact 61b (second node NB). In the transistor P2 (load transistor PU2), the pad 22p is connected to the line 71 that supplies the voltage VDD, the pad 22o is connected to the local interconnect 41i (second node NB), and the gate line 33 is connected to the shared-contact 61a (first node NA). In the transistors N3 and N4 (drive transistor PD1), the pads 22h and 22k are connected to the local interconnects 41e and 41h (first node NA), the pads 22g and 22j are connected to the power supply line 12 that supplies the voltage VSS, and the gate line 32 is connected to the shared-contact 61b (second node NB). In the transistors N5 and N6 (drive transistor PD2), the pads 22b and 22e are connected to the local interconnects 41b and 41i (second node NB), the pads 22c and 22f are connected to the power supply line 11 that supplies the voltage VSS, and the gate line 33 is connected to the shared-contact 61a (first node NA). In the transistors N7 and N8 (access transistor PG1), the pads 22i and 22l are connected to the line 72 (bit line BL), the pads 22h and 22k are connected to the local interconnect 41e and 41h (first node NA), and the gate line 34 is connected to the line 81 (word line WL). In the transistors N1 and N2 (access transistor PG2), the pads 22a and 22d are connected to the line 73 (bit line BLB), the pads 22b and 22e are connected to the local interconnect 41b and 41i (second node NB), and the gate line 31 is connected to the line 81 (word line WL).

That is, the transistors N1 to N8, P1, and P2 form a 1-port SRAM circuit. Each of the transistors N1 to N8, P1, and P2 is a three-dimensional transistor.

Further, the transistors P1 and P2 correspond to the load transistors PU1 and PU2, respectively. The transistors N1 and N2 connected in parallel correspond to the access transistor PG2. The transistors N3 and N4 connected in parallel correspond to the drive transistor PD1. The transistors N5 and N6 connected in parallel correspond to the drive transistor PD2. The transistors N7 and N8 connected in parallel correspond to the access transistor PG1. That is, each of the load transistors PU1 and PU2 is configured by a single transistor, and the drive transistors PD1 and PD2 and the access transistors PG1 and PG2 are each configured by two transistors connected in parallel. Therefore, the number of transistors constituting the load transistor PU1 and the number of transistors constituting the load transistor PU2 are smaller than the number of transistors constituting the drive transistor PD1 and smaller than the number of transistors constituting the drive transistor PD2, respectively.

This way, it is possible to achieve a layout configuration of a 1-port SRAM cell using a CFET, in which six transistors (the load transistors PU1 and PU2, the drive transistors PD1 and PD2, and the access transistors PG1 and PG2) constituting a 1-port SRAM circuit of the 1-port SRAM cell are configured by different numbers of nanowire transistors. As a result, the operation speed and the operation stability of the semiconductor memory device can be improved.

Further, the transistors N1, N3, N5, and N7 overlap the transistors N2, N4, N6, and N8, respectively, in plan view. That is, the transistors N1, N3, N5, and N7 are stacked on the transistors N2, N4, N6, and N8, respectively. This way, the area of the 1-port SRAM cell can be reduced.

Further, the drive transistors PD1 and PD2 and the access transistors PG1 and PG2 are each configured by two transistors connected in parallel. As a result, it is possible to facilitate reading data from the 1-port SRAM cell and writing data to the 1-port SRAM cell, and to raise the operation speed of the semiconductor memory device.

Further, transistors N1, N3, N5, and N7 and the dummy transistors N21 and N22 overlap the transistors N2, N4, N6, N8, P1, and P2, respectively, in plan view. That is, the transistors N1, N3, N5, and N7 and the dummy transistors N21 and N22 are stacked on the transistors N2, N4, N6, N8, P1, and P2, respectively. Since each transistor is stacked with another transistor, there is no need for, for example, partially removing the transistors. This keeps the manufacturing process from being complicated.

Further, the transistors N1, N3, N5, and N7 and the dummy transistors N21 and N22 are formed in the lower portion of the cell, and transistors N2, N4, N6, N8, P1, and P2 are formed in the upper portion of the cell. That is, the above configuration can be achieved by forming only the N-type FETs in the lower portion of the cell, and partially replacing the transistors formed in the upper portion of the cell with the N-type FET. This keeps the manufacturing process from being complicated.

Note that none of the nodes of the dummy transistors N21 and N22 are connected to the local interconnects. Therefore, the dummy transistors N21 and N22 do not affect the logic function of the 1-port SRAM cells. Further, the dummy transistors N21 and N22 do not have to be formed in the 1-port SRAM cell of the present embodiment. However, by forming the dummy transistors N21 and N22, it is possible to suppress manufacturing-attributed variations of the semiconductor memory devices, and improve the yield and the reliability of the semiconductor memory devices.

Further, although the line 71 that supplies the voltage VDD is provided in the M1 wiring layer, the power supply line that supplies the voltage VDD may be provided in the buried wiring layer. Further, the power supply line that supplies the voltage VDD may be provided in both the M1 wiring layer and the buried wiring layer. In this case, since the power source that supplies the voltage VDD is strengthened, the power source can be stabilized.

(Variation 1)

Figure 7:
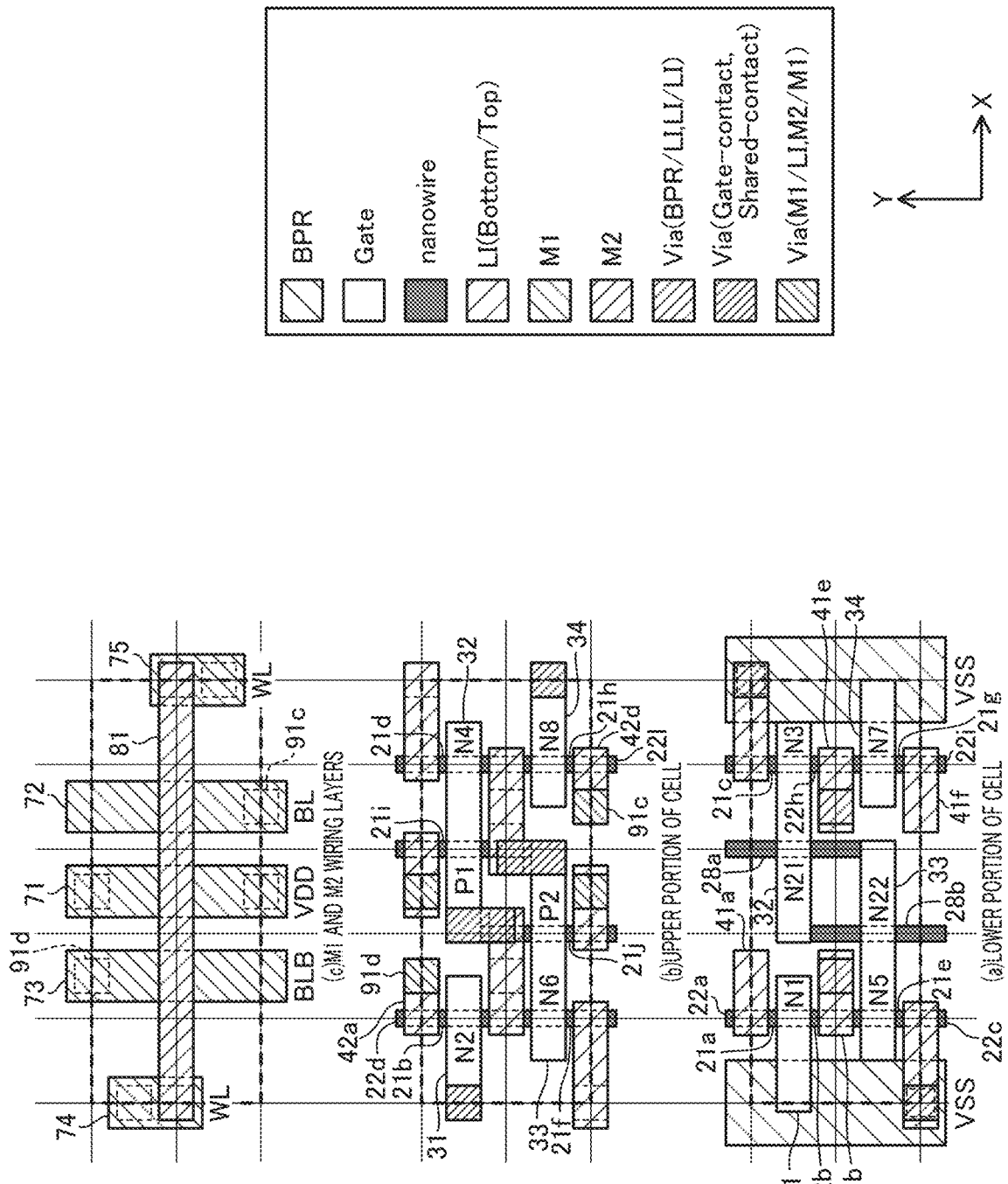
FIG. 7 is a plan view showing another exemplary layout configuration of the 1-port SRAM cell related to the second embodiment.

FIG. 7 is a plan view showing another exemplary layout configuration of the 1-port SRAM cell related to the second embodiment. Specifically, an illustration (a) of FIG. 7 shows a lower portion of the cell, an illustration (b) of FIG. 7 shows an upper portion of the cell, and an illustration (c) of FIG. 7 shows M1 and M2 wiring layers. In FIG. 7, the contacts 52a and 52d are not formed as compared with FIG. 6. That is, the local interconnect 41a and the local interconnect 42a are not connected to each other, and the local interconnect 41f and the local interconnect 42d are not connected to each other. Therefore, in FIG. 7, each of the access transistors PG1 and PG2 is configured by a single transistor.

Specifically, in FIG. 7, the contact 52a that connects the local interconnects 41a and 42a, and the contact 52d that connects the local interconnects 41f and 42d are not formed. Therefore, the pad 22a of the transistor N1 does not receive a signal input through the local interconnect 41a. The pad 22i of the transistor N7 does not receive a signal input through the local interconnect 41f. This means that one node of each of the transistors N1 and N7 is in a floating state, and hence, the transistors N1 and N7 are dummy transistors having no logic function. Therefore, in FIG. 7, the access transistor PG1 is configured by only the transistor N8, and the access transistor PG1 is configured by only the transistor N2.

This variation brings about effects similar to those of the 1-port SRAM cell related to the second embodiment.

Further, transistors N1, N3, N5, and N7 and the dummy transistors N21 and N22 overlap the transistors N2, N4, N6, N8, P1, and P2, respectively, in plan view. That is, the transistors N1, N3, N5, and N7 and the dummy transistors N21 and N22 are stacked on the transistors N2, N4, N6, N8, P1, and P2, respectively. Since each transistor is stacked with another transistor, there is no need for, for example, partially removing the transistors. This keeps the manufacturing process from being complicated.

(Variation 2)

Figure 8:
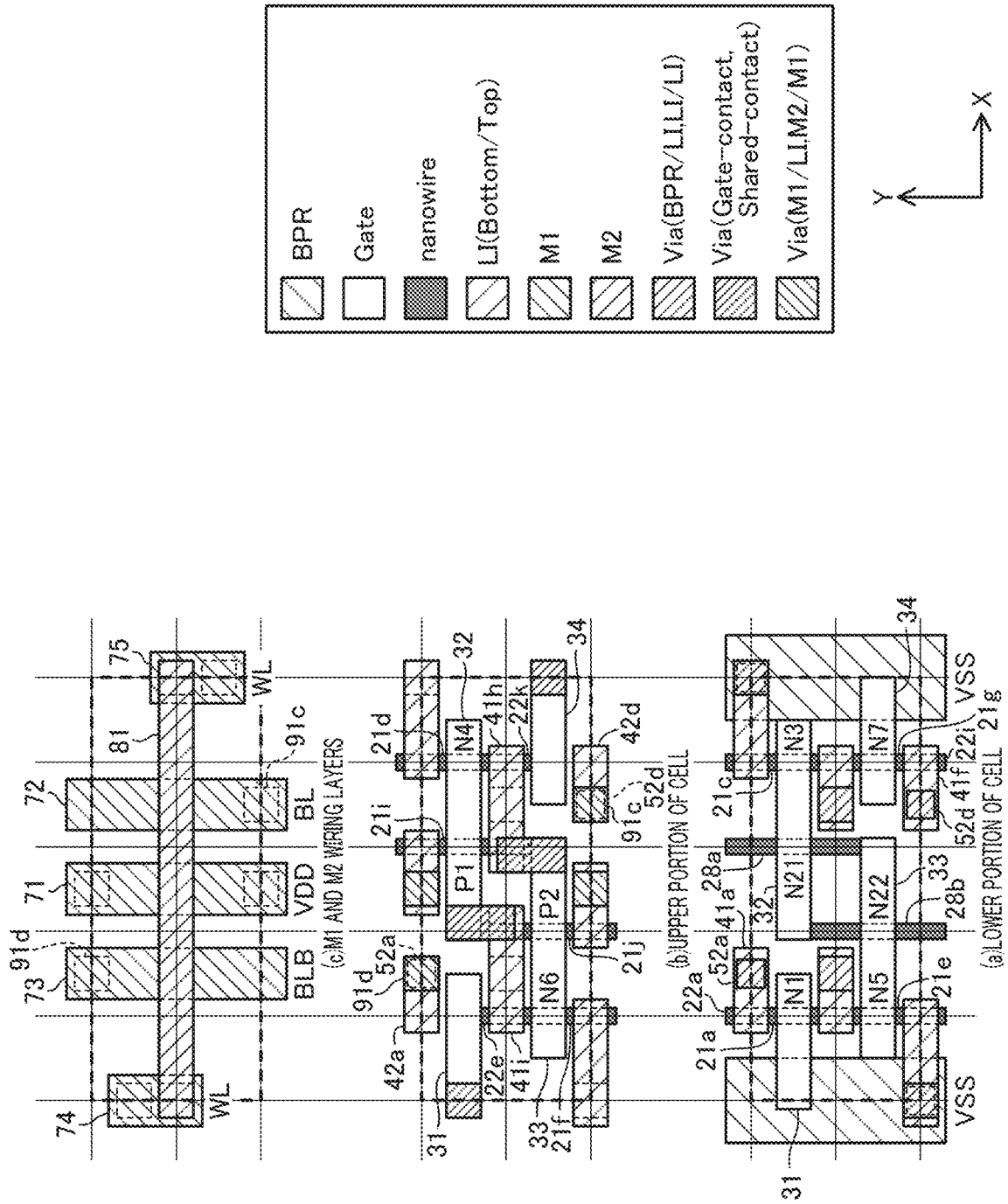
FIG. 8 is a plan view showing another exemplary layout configuration of the 1-port SRAM cell related to the second embodiment.

FIG. 8 is a plan view showing another exemplary layout configuration of the 1-port SRAM cell related to the second embodiment. Specifically, an illustration (a) of FIG. 8 shows a lower portion of the cell, an illustration (b) of FIG. 8 shows an upper portion of the cell, and an illustration (c) of FIG. 8 shows M1 and M2 wiring layers. In FIG. 8, transistors N2 and N8 are not formed in the upper portion of the cell as compared to FIG. 6. That is, in FIG. 8, each of the access transistors PG1 and PG2 is configured by a single transistor.

Specifically, nanowires 21b and 21h and pads 22d and 22l are not formed in the upper portion of the cell. That is, in FIG. 8, the access transistor PG1 is configured by only the transistor N7, and the access transistor PG2 is configured by only the transistor N1.

This variation brings about effects similar to those of the 1-port SRAM cell related to the second embodiment.

Further, transistors N2 and N8 are not formed in the upper portion of the cell. Thus, the load capacity of the 1-port SRAM cell can be suppressed.

Note that the present variation deals with a case where the transistors N2 and N8 are not formed in the upper portion of the cell; however, the present disclosure is not limited to this. The transistors N2 and N8 may be formed in the upper portion of the cell without forming the transistors N1 and N7 in the lower portion of the cell.

(Variation 3)

Figure 9:
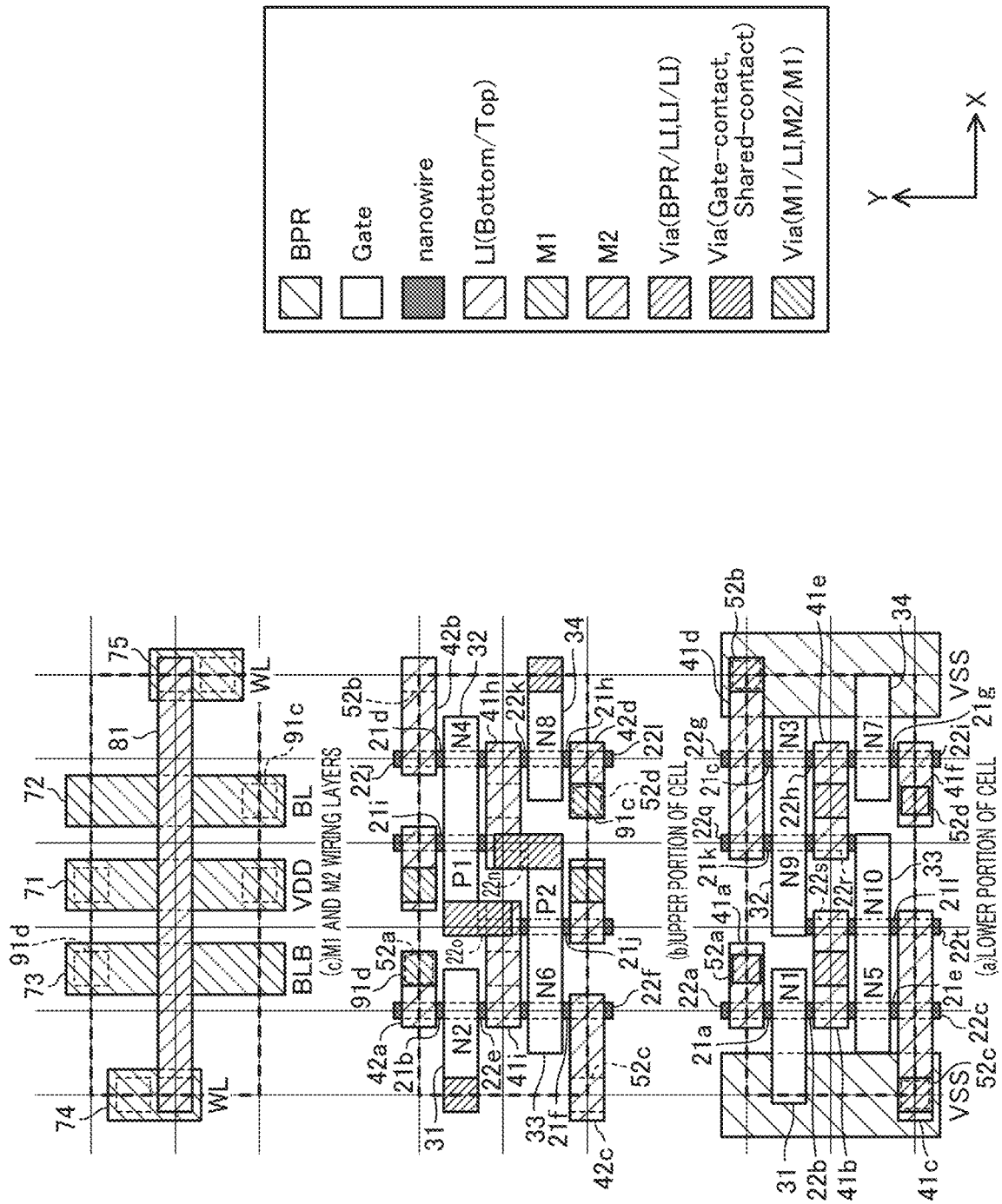
FIG. 9 is a plan view showing another exemplary layout configuration of the 1-port SRAM cell related to the second embodiment.

FIG. 9 is a plan view showing another exemplary layout configuration of the 1-port SRAM cell related to the second embodiment. Specifically, an illustration (a) of FIG. 9 shows a lower part of the cell, an illustration (b) of FIG. 9 shows an upper part of the cell, and an illustration (c) of FIG. 9 shows M1 and M2 wiring layers. In FIG. 9, transistors N9 and N10 are formed instead of the dummy transistors N21 and N22, in the lower portion of the cell as compared to FIG. 6. In FIG. 9, each of the drive transistors PD1 and PD2 is configured by three transistors.

Specifically, in the lower portion of the cell, nanowires 21k and 21l extending in the Y direction are formed. The nanowire 21k is formed so as to align with nanowires 21a and 21c in the X direction, and the nanowire 21l is formed so as to align with nanowires 21e and 21g in the X direction. Further, the nanowires 21k and 21l overlap the nanowires 21i and 21j, respectively, in plan view.

A gate line 32 serves as the gate of the transistor N9, and a gate line 33 serves as the gate of the transistor N10. Pads 22q to 22t doped to the N-type semiconductor are formed at the upper end of the nanowire 21k in the figure, at the lower end of the nanowire 21k in the figure, at the upper end of the nanowire 21l in the figure, and at the lower end of the nanowire 21l in the figure, respectively. The nanowires 21k and 21l constitute channel portions of the transistors N9 to N10, respectively. The pads 22q and 22r constitute a node of the transistor N9, and the pads 22s and 22t constitute a node of the dummy transistor N10.

That is, the nanowire 21k, the gate line 32, and the pads 22q and 22r constitute the transistor N9. The nanowire 21l, the gate line 33, and the pads 22s and 22t constitute the transistor N10.

Thus, the transistors N9 and N10 overlap the transistors P1 and P2, respectively, in plan view. Further, the transistor N9 is formed so as to align with transistors N1 and N3 in the X direction, and the transistor N10 is formed so as to align with transistors N5 and N7 in the X direction.

A local interconnect 41b is connected to pads 22b and 22s in the lower portion of the cell. A local interconnect 41c is connected to pads 22c and 22t. A local interconnect 41d is connected to pads 22g and 22q. A local interconnect 41e is connected to pads 22h and 22r.

That is, the transistors N3, N4, and N9 have their pads connected to each other via a local interconnect, and share a gate line. The transistors N5, N6, and N10 have their pads connected to each other via a local interconnect, and share a gate line. Further, in FIG. 9, the transistors N3, N4, and N9 correspond to the drive transistor PD1, and the transistors N5, N6, and N10 correspond to the drive transistor PD2. Thus, in FIG. 9, the drive transistors PD1 and PD2 are each configured by three N-type FETs connected in parallel.

This variation brings about effects similar to those of the 1-port SRAM cell related to the second embodiment.

Further, the drive transistor PD1 is configured by the transistors N3, N4, and N9 connected in parallel. The drive transistor PD2 is configured by the transistors N5, N6, and N10 connected in parallel. As a result, it is possible to improve the drive performance, raise the speed of the reading operation, and improve the stability of the operation of the 1-port SRAM cell.

Instead of the dummy transistors N21 and N22, the transistors N9 and N10 are arranged in the 1-port SRAM cell. It is therefore possible to improve the drive performance, raise the speed of the reading operation, and improve the stability of the operation of the 1-port SRAM cell without changing the cell width (the width of the cell in the X direction) of the 1-port SRAM cell.

Note that the number of three-dimensional transistors constituting each of the load transistors PU1 and PU2, the drive transistors PD1 and PD2, and the access transistors PG1 and PG2 is not limited to the numbers described in the above embodiments and variations thereof. For example, in the case of increasing the number of the drive transistors PD1 and PD2 and the access transistors PG1 and PG2, the three-dimensional transistors may be formed such that the drive transistors PD1 and PD2 and the access transistors PG1 and PG2 described in the above embodiments align in the X direction. In this case, the number of either one of the drive transistor (drive transistors PD1 and PD2) or the access transistor (access transistors PG1 and PG2) may be increased, or the numbers of both the drive transistor and the access transistor may be increased.

Further, each embodiment described hereinabove deals with a case where each transistor includes one nanowire; however, a part of or all of the transistors may include a plurality of nanowires. In such a case, a plurality of nanowires may be arranged in the X direction or in the Z direction in plan view. Further, a plurality of nanowires may be arranged in both of the X direction and the Z direction. Further, the numbers of nanowires the transistor has in the upper and lower portions of the cell may be different.

Further, in each of the above embodiments, each transistor may be configured by a plurality of transistors connected in parallel.

In addition, in each of the above-described embodiments, the cross-sectional shape of the nanowire is substantially a square, but the cross-sectional shape of the nanowire is not limited to this. For example, the cross-sectional shape may be circular or rectangular shape.

Further, the above-described embodiments describe the nanowire FET as an exemplary three-dimensional transistor. However, the three-dimensional transistor is not limited to this. For example, the transistor formed in the lower portion of the cell may be a fin-type transistor.

INDUSTRIAL APPLICABILITY

Since the present disclosure can be applied to a semiconductor memory device including an SRAM cell using a CFET, a 1-port SRAM cell using a CFET can be achieved, and the area of the 1-port SRAM cell can be reduced.

DESCRIPTION OF REFERENCE CHARACTERS 11, 12, 13 Power Supply Line
21a to 21l Nanowire
22a to 22t Pad
N1 to N10, P1, P2 Transistor
72 to 75, 81 Line
PU1, PU2 Load Transistor
PD1, PD2 Drive Transistor
PG1, PG2 Access Transistor
WL Word Line
BL, BLB Bit Line

The invention claimed is:

1. A semiconductor memory device, comprising a 1-port SRAM cell, wherein:
the 1-port SRAM cell comprises:
a first transistor having one node connected to a first power source that supplies a first voltage, another node connected to a first node, and a gate connected to a second node;
a second transistor having one node connected to the first power source, another node connected to the second node, and a gate connected to the first node;
a third transistor having one node connected to the first node, another node connected to a second power source that supplies a second voltage different from the first voltage, and a gate connected to the second node;
a fourth transistor having one node connected to the second node, another node connected to the second power source, and a gate connected to the first node;
a fifth transistor having one node connected to a first bit line, another node connected to the first node, and a gate connected to a word line; and
a sixth transistor having one node connected to a second bit line constituting a complementary bit line pair with the first bit line, another node connected to the second node, and a gate connected to the word line,
each of the third to sixth transistors is a three-dimensional transistor of a first conductive type formed in a first layer,
each of the first and second transistors is a three-dimensional transistor of a second conductive type different from the first conductive type, the three-dimensional transistor being formed in a second layer different from the first layer,
the number of three-dimensional transistors constituting the first transistor is smaller than the number of three-dimensional transistors constituting the third transistor,
the number of three-dimensional transistors constituting the second transistor is smaller than the number of three-dimensional transistors constituting the fourth transistor,
the first transistor at least partially overlaps the third transistor in plan view,
the second transistor at least partially overlaps the fourth transistor in plan view,
each of the first to sixth transistors includes one or more nanowires each including a channel portion and extending in a first direction perpendicular to the depth direction, and
the first transistor does not overlap the fifth transistor in plan view, and the second transistor does not overlap the sixth transistor in plan view.

2. The semiconductor memory device of claim 1, wherein each of the third and fourth transistors includes first and second three-dimensional transistors arranged to align in a second direction perpendicular to a first direction that is a direction in which channel portions of the first to sixth transistors extend.

3. The semiconductor memory device of claim 2, wherein each of the fifth and sixth transistors includes third and fourth three-dimensional transistors arranged to align in the second direction.

4. The semiconductor memory device of claim 3, wherein the first and second three-dimensional transistors in the third transistor are arranged to align, in the first direction, with the third and fourth three-dimensional transistors in the fifth transistor, respectively, and
the first and second three-dimensional transistors in the fourth transistor are arranged to align, in the first direction, with the third and fourth three-dimensional transistors in the sixth transistor, respectively.

5. The semiconductor memory device of claim 2, wherein each of the fifth and sixth transistors is a third three-dimensional transistor, the third three-dimensional transistor in the fifth transistor is arranged to align, in the first direction, with one of the first or second three-dimensional transistor in the third transistor, and the third three-dimensional transistor in the sixth transistor is arranged to align, in the first direction, with one of the first or second three-dimensional transistor in the fourth transistor.

6. The semiconductor memory device of claim 5, wherein the second layer is positioned above the first layer.

7. The semiconductor memory device of claim 1, wherein the second layer is positioned above the first layer.

8. The semiconductor memory device of claim 1, wherein the second layer is positioned below the first layer.

9. The semiconductor memory device of claim 1, wherein a same first gate line is directly connected to the gates of the first and third transistor, and a same second gate line is directly connected to the gates of the second and fourth transistors.

10. The semiconductor memory device of claim 1, wherein:
the first transistor includes a first channel portion,
the second transistor includes a second channel portion,
the third transistor includes
  a third channel portion that overlaps the first channel portion in plan view, and
  a fourth channel portion that does not overlap the first channel portion in plan view, and
the fourth transistor includes
  a fifth channel portion that overlaps the second channel portion in plan view, and
  a sixth channel portion that does not overlap the second channel portion in plan view.

11. A semiconductor memory device, comprising a 1-port SRAM cell, wherein:
the 1-port SRAM cell comprises:
  a first transistor having one node connected to a first power source that supplies a first voltage, another node connected to a first node, and a gate connected to a second node;
  a second transistor having one node connected to the first power source, another node connected to the second node, and a gate connected to the first node;
  a third transistor having one node connected to the first node, another node connected to a second power source that supplies a second voltage different from the first voltage, and a gate connected to the second node;
  a fourth transistor having one node connected to the second node, another node connected to the second power source, and a gate connected to the first node;
  a fifth transistor having one node connected to a first bit line, another node connected to the first node, and a gate connected to a word line; and
  a sixth transistor having one node connected to a second bit line constituting a complementary bit line pair with the first bit line, another node connected to the second node, and a gate connected to the word line,
the third and fourth transistors each include:
  a first three-dimensional transistor that is a three-dimensional transistor of a first conductive type formed in a first layer; and
  a second three-dimensional transistor that is a three-dimensional transistor of the first conductive type formed in a second layer that is a layer above the first layer so that the second three-dimensional transistor at least partially overlaps the first three-dimensional transistor in plan view,
each of the fifth and sixth transistors includes a three-dimensional transistor of the first conductive type formed in at least one of the first or second layer,
each of the first and second transistors includes a three-dimensional transistor of a second conductive type different from the first conductive type formed in the second layer,
the number of three-dimensional transistors constituting the first transistor is smaller than the number of three-dimensional transistors constituting the third transistor,
the number of three-dimensional transistors constituting the second transistor is smaller than the number of three-dimensional transistors constituting the fourth transistor,
the 1-port SRAM cell further comprises:
  a first dummy transistor that is a three-dimensional transistor of the first conductive type formed in the first layer; and
  a second dummy transistor that is a three-dimensional transistor of the first conductive type formed in the first layer, and
the fifth and sixth transistors each include a three-dimensional transistor formed in the second layer, and at least partially overlap the first and second dummy transistors in plan view, respectively.

12. The semiconductor memory device of claim 11, wherein
the fifth and sixth transistors each include:
  a third three-dimensional transistor formed in the first layer; and
  a fourth three-dimensional transistor formed in the second layer so as to overlap at least partially the third three-dimensional transistor in plan view.

13. The semiconductor memory device of claim 12, wherein
the first and second three-dimensional transistors in the third transistor are arranged to align, in a first direction, with the third and fourth three-dimensional transistors in the fifth transistor, respectively, the first direction being a direction in which channel portions of the first to sixth transistors extend, and
the first and second three-dimensional transistors in the fourth transistor are arranged to align, in the first direction, with the third and fourth three-dimensional transistors in the sixth transistor, respectively.

14. The semiconductor memory device of claim 12, wherein
in each of the third and fourth transistors, the first three-dimensional transistor includes a plurality of first three-dimensional transistors arranged to align in a second direction perpendicular to a first direction that is a direction in which channel portions of the first to sixth transistors extend.

15. The semiconductor memory device of claim 14, wherein
the first transistor at least partially overlaps any of the plurality of first three-dimensional transistors in the third transistor in plan view, and
the second transistor at least partially overlaps any of the plurality of first three-dimensional transistors in the fourth transistor in plan view.

16. The semiconductor memory device of claim 14, wherein
the third three-dimensional transistor in the fifth transistor is arranged to align, in the first direction, with any of the plurality of first three-dimensional transistors in the third transistor, and
the third three-dimensional transistor in the sixth transistor is arranged to align, in the first direction, with any of the plurality of first three-dimensional transistors in the fourth transistor.

17. The semiconductor memory device of claim 11, wherein
the fifth and sixth transistors are arranged to align, in a first direction, with the second three-dimensional transistors in the third and fourth transistors, respectively, the first direction being a direction in which channel portions of the first to sixth transistors extend, and
the first and second dummy transistors are arranged to align, in the first direction, with the first three-dimensional transistors in the third and fourth transistors, respectively.

18. The semiconductor memory device of claim 11, wherein
the fifth transistor is arranged to align, in a first direction, with at least one of the first or second three-dimensional transistor in the third transistor, the first direction being a direction in which channel portions of the first to sixth transistors extend, and
the sixth transistor is arranged to align, in the first direction, with at least one of the first or second three-dimensional transistor in the fourth transistor.

19. The semiconductor memory device of claim 11, wherein
each of the fifth and sixth transistors includes a three-dimensional transistor formed in the first layer,
the fifth transistor is arranged to align, in a first direction, with the first three-dimensional transistor in the third transistor, the first direction being a direction in which channel portions of the first to sixth transistors extend, and
the sixth transistor is arranged to align, in the first direction, with the first three-dimensional transistor in the fourth transistor.

20. The semiconductor memory device of claim 11, wherein
a same first gate line is directly connected to the gates of the first and second three-dimensional transistors in the third transistor, and a same second gate line is directly connected to the gates of the first and second three-dimensional transistors in the fourth transistor.

* * * * *